(12) United States Patent
Kolli et al.

(10) Patent No.: US 10,848,690 B2
(45) Date of Patent: Nov. 24, 2020

(54) DUAL IMAGE SENSORS ON A COMMON SUBSTRATE

(71) Applicant: INVISAGE TECHNOLOGIES, INC., Newark, CA (US)

(72) Inventors: Naveen Kolli, Fremont, CA (US); Emanuele Mandelli, Mountain View, CA (US); Nicola Galante, Foster City, CA (US)

(73) Assignee: INVISAGE TECHNOLOGIES, INC., Newark, CA (US)

( * ) Notice: Subject to any disclaimer, the term of this patent is extended or adjusted under 35 U.S.C. 154(b) by 1 day.

(21) Appl. No.: 16/341,905

(22) PCT Filed: Oct. 19, 2017

(86) PCT No.: PCT/US2017/057282
§ 371 (c)(1),
(2) Date: Apr. 14, 2019

(87) PCT Pub. No.: WO2018/075704
PCT Pub. Date: Apr. 26, 2018

(65) Prior Publication Data
US 2019/0253643 A1    Aug. 15, 2019

Related U.S. Application Data

(60) Provisional application No. 62/411,497, filed on Oct. 21, 2016, provisional application No. 62/411,522, (Continued)

(51) Int. Cl.
*H04N 5/33*     (2006.01)
*H01L 27/146*    (2006.01)
(Continued)

(52) U.S. Cl.
CPC ....... *H04N 5/332* (2013.01); *H01L 27/14605* (2013.01); *H01L 27/14612* (2013.01);
(Continued)

(58) Field of Classification Search
CPC ........ H04N 5/332; H04N 5/345; H04N 5/359; H04N 5/3594; H04N 5/361; H04N 5/3696;
(Continued)

(56) References Cited

U.S. PATENT DOCUMENTS 6,278,142 B1 *   8/2001   Hynecek ........... H01L 27/14812
                                                                     257/243
6,326,230 B1 *   12/2001   Pain .................. H01L 27/14609
                                                                    257/E27.132
(Continued)

FOREIGN PATENT DOCUMENTS

GB          2505954 A      3/2014
WO     2015029425 A1    3/2015
(Continued)

OTHER PUBLICATIONS

EP Application # 167378751 office action dated Nov. 26, 2019.
(Continued)

*Primary Examiner* — Mishawn N. Hunter
(74) *Attorney, Agent, or Firm* — Kligler & Associates Patent Attorneys Ltd

(57) ABSTRACT

Imaging apparatus (1300, 1400, 1500) includes a semiconductor substrate (1302), which includes at least first and second sensing areas (1306, 1308, 1502, 1514) with a predefined separation between the sensing areas. First and second arrays of pixel circuits (1312) are formed respectively on the first and second sensing areas and define respective first and second matrices of pixels. First and second photosensitive films (1314, 1316, 1402) are disposed (Continued)

respectively over the first and second arrays of pixel circuits, and are configured to output photocharge to the pixel circuits in response to radiation incident on the apparatus in different, respective first and second spectral bands.

19 Claims, 12 Drawing Sheets

Related U.S. Application Data filed on Oct. 21, 2016, provisional application No. 62/411,519, filed on Oct. 21, 2016, provisional application No. 62/411,517, filed on Oct. 21, 2016, provisional application No. 62/410,792, filed on Oct. 20, 2016, provisional application No. 62/410,797, filed on Oct. 20, 2016, provisional application No. 62/410,793, filed on Oct. 20, 2016.

(51) Int. Cl.
  *H04N 5/345* (2011.01)
  *H04N 5/359* (2011.01)
  *H04N 5/361* (2011.01)
  *H04N 5/369* (2011.01)
  *H04N 5/374* (2011.01)
  *H04N 9/04* (2006.01)

(52) U.S. Cl.
  CPC .. *H01L 27/14621* (2013.01); *H01L 27/14623* (2013.01); *H01L 27/14627* (2013.01); *H01L 27/14636* (2013.01); *H01L 27/14645* (2013.01); *H01L 27/14649* (2013.01); *H01L 27/14665* (2013.01); *H01L 27/14685* (2013.01); *H01L 27/14689* (2013.01); *H04N 5/345* (2013.01); *H04N 5/359* (2013.01); *H04N 5/3594* (2013.01); *H04N 5/361* (2013.01); *H04N 5/3696* (2013.01); *H04N 5/374* (2013.01); *H04N 9/045* (2013.01)

(58) Field of Classification Search
  CPC .. H04N 5/374; H04N 9/045; H01L 27/14605; H01L 27/14612; H01L 27/14621; H01L 27/14623; H01L 27/14627; H01L 27/14636; H01L 27/14645; H01L 27/14665; H01L 27/14685; H01L 27/14689

See application file for complete search history.

(56) References Cited

U.S. PATENT DOCUMENTS

| | | | |
|---|---|---|---|
| 7,923,801 B2 | 4/2011 | Tian et al. | |
| 8,754,967 B2 | 6/2014 | Hirota | |
| 8,817,166 B2 | 8/2014 | Shimoda et al. | |
| 9,973,678 B2 | 5/2018 | Mandelli et al. | |
| 10,277,847 B2 | 4/2019 | Nakata et al. | |
| 2011/0157355 A1* | 6/2011 | Ivanov | H04N 7/181 348/143 |
| 2011/0267510 A1 | 11/2011 | Malone et al. | |
| 2012/0033120 A1 | 2/2012 | Nakamura et al. | |
| 2013/0240710 A1 | 9/2013 | Choi | |
| 2015/0092092 A1 | 4/2015 | Okigawa | |
| 2015/0195466 A1 | 7/2015 | Takase et al. | |
| 2015/0288901 A1 | 10/2015 | Tanaka | |
| 2016/0037114 A1 | 2/2016 | Mandelli et al. | |
| 2016/0155882 A1 | 6/2016 | Tian et al. | |
| 2016/0284749 A1 | 9/2016 | Kurokawa | |
| 2017/0208273 A1 | 7/2017 | Mandelli et al. | |
| 2017/0249520 A1* | 8/2017 | Lee | H01L 31/0203 |
| 2017/0264836 A1 | 9/2017 | Mandelli et al. | |

FOREIGN PATENT DOCUMENTS

| WO | 2016072281 A1 | 5/2016 |
|---|---|---|
| WO | 2018075706 A1 | 4/2018 |

OTHER PUBLICATIONS

CN Application # 201680015761.1 office action dated Jul. 18, 2019.
International Application #PCT/US2017/057282 search report dated Jan. 11, 2018.

* cited by examiner

DUAL IMAGE SENSORS ON A COMMON SUBSTRATE

CROSS-REFERENCE TO RELATED APPLICATION

This application claims the benefit of the following U.S. provisional patent applications, whose disclosures are incorporated herein by reference:

U.S. Provisional Patent Application 62/410,792, filed Oct. 20, 2016;
U.S. Provisional Patent Application 62/410,793, filed Oct. 20, 2016;
U.S. Provisional Patent Application 62/410,797, filed Oct. 20, 2016;
U.S. Provisional Patent Application 62/411,497, filed Oct. 21, 2016;
U.S. Provisional Patent Application 62/411,517, filed Oct. 21, 2016;
U.S. Provisional Patent Application 62/411,519, filed Oct. 21, 2016; and
U.S. Provisional Patent Application 62/411,522, filed Oct. 21, 2016.

FIELD OF THE INVENTION

The present invention relates generally to image sensing devices, and particularly to circuits and methods for enhancing the performance of film-based image sensors.

BACKGROUND

In film-based image sensors, a silicon-based switching array is overlaid with a photosensitive film such as a film containing a dispersion of quantum dots (referred to herein as a "quantum film"). The switching array, which can be similar to those used in complementary metal-oxide sandwich (CMOS) image sensors that are known in the art, is coupled by suitable electrodes to the film in order to read out the photocharge that accumulates in each pixel of the film due to incident light.

SUMMARY

Embodiments of the present invention that are described hereinbelow provide enhanced image sensor designs and methods for operation of image sensors with enhanced performance.

There is therefore provided, in accordance with an embodiment of the invention, imaging apparatus, including a semiconductor substrate, which includes at least first and second sensing areas with a predefined separation between the sensing areas. First and second arrays of pixel circuits are formed respectively on the first and second sensing areas and define respective first and second matrices of pixels. First and second photosensitive films are disposed respectively over the first and second arrays of pixel circuits, and are configured to output photocharge to the pixel circuits in response to radiation incident on the apparatus in different, respective first and second spectral bands.

In a disclosed embodiment, the photosensitive films include quantum films.

In some embodiments, the first and second photosensitive films include different, respective materials, which are respectively sensitive to the incident radiation in the first and second spectral bands. Alternatively, the first and second photosensitive films include an identical film having a spectral response extending over the first and second spectral bands, and the apparatus includes at least a first filter, having a passband within the first spectral band, overlying the first photosensitive film.

In a disclosed embodiment, the first spectral band is a visible band, and the second spectral band is an infrared band.

In one embodiment, the apparatus includes microlenses formed over the first and second photosensitive films in registration with the arrays of pixel circuits. Additionally or alternatively, the apparatus includes control circuitry formed on the semiconductor substrate and coupled to communicate with both of the first and second arrays of pixel circuits. Further additionally or alternatively, the apparatus includes first and second imaging optics, which are configured to focus first and second images, respectively, onto the first and second photosensitive films.

In a disclosed embodiment, the apparatus includes an opaque layer formed over the photosensitive film on one or more of the pixels in one of the arrays. Control circuitry is coupled to receive signals from the pixel circuits in response to the photocharge output by the photosensitive films, and to convert the received signals to respective pixel output values while correcting a black level of the output values from both the first and second arrays using the signals received from the one or more of the pixels over which the opaque layer is formed.

In some embodiments, the apparatus includes first and second common electrodes, which are at least partially transparent and are formed respectively over the first and second photosensitive film. Control circuitry is coupled to apply a bias to the first and second common electrodes and to receive signals from the first and second arrays of pixel circuits due to photocharge accumulated by the pixel circuits in response to application of the bias. The control circuitry may be configured to bias both the first and second common electrodes at a common potential or to bias the first and second common electrodes at different, respective first and second potentials.

There is also provided, in accordance with an embodiment of the invention, a method for producing an image sensor. The method includes forming first and second arrays of pixel circuits, defining respective first and second matrices of pixels, on respective first and second sensing areas of a semiconductor substrate with a predefined separation between the sensing areas. First and second photosensitive films are formed respectively over the first and second arrays of pixel circuits, so as to output photocharge to the pixel circuits in response to radiation incident on the image sensor in different, respective first and second spectral bands.

The present invention will be more fully understood from the following detailed description of the embodiments thereof, taken together with the drawings in which:

DETAILED DESCRIPTION OF EMBODIMENTS

System Overview

Figure 1:
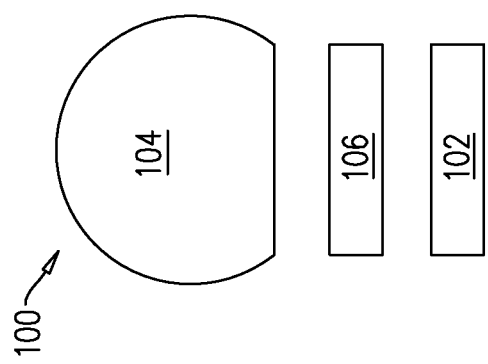
FIG. 1 is a schematic side view of a camera module, which is operative in accordance with an embodiment of the invention.

The image sensors described herein may be used within any suitable imaging device, such as a camera, spectrometer, light sensor, or the like. FIG. 1 shows one example of a camera module 100 that may utilize an image sensor 102, which may be configured in any manner as described below. The camera module 100 may comprise a lens system 104, which may direct and focus incoming light onto image sensor 102. While depicted in FIG. 1 as a single element, it should be appreciated that lens system 104 may actually include a plurality of lens elements, some or all of which may be fixed relative to each other (e.g., via a lens barrel or the like). The camera module 102 may optionally be configured to move the lens system 104 and/or the image sensor 102 to perform autofocus and/or optical image stabilization.

The camera module may further comprise one or more optional filters, such as a filter 106, which may be placed along the optical path. Filter 106 may reflect or otherwise block certain wavelengths of light, and may substantially prevent, based on the effectiveness of the filter, these wavelengths of light from reaching the image sensor 102. As an example, when an image sensor is configured to measure visible light, filter 106 may comprise an infrared cutoff filter. While shown in FIG. 1 as being positioned between image sensor 102 and lens system 104, filter 106 may be positioned to cover lens system 104 (relative to incoming light) or may be positioned between lenses of lens system 104.

Figure 2:
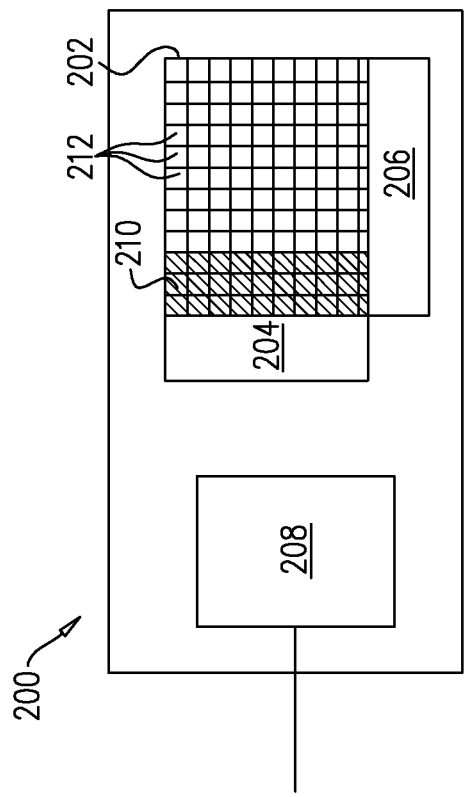
FIG. 2 is a schematic top view of an example image sensor, in accordance with an embodiment of the invention.

FIG. 2 shows a top view of an exemplary image sensor 200 as described herein. Image sensor 200 may comprise an imaging area comprising a pixel array 202, which may include a first plurality of pixels 212 that may be used to convert incident light into electrical signals. In some instances, pixel array 202 may comprise an obscured region 210 including at least one pixel (e.g., a second plurality of pixels) that is obscured relative to incoming light (e.g., covered by a light-blocking layer). Electrical signals may still be read out from some or all of these pixels, but since there is ideally no light reaching these pixels, the current measured from these pixels may represent the dark current associated with one or more components of the image sensor. Image sensor 200 (or associated processing circuitry) may compensate for the dark current levels during image capture and/or processing.

Image sensor 200 may further comprise row circuitry 204 and column circuitry 206, which collectively may be used to convey various signals (e.g., bias voltages, reset signals) to individual pixels as well as to read out signals from individual pixels. For example, row circuitry 204 may be configured to simultaneously control multiple pixels in a given row, while column circuitry 206 may convey pixel electrical signals to other circuitry for processing. Accordingly, image sensor 200 may comprise control circuitry 208, which may control the row circuitry 204 and column circuitry 206, as well as performing input/output operations (e.g., parallel or serial IO operations) for image sensor 200. The control circuitry may include a combination of analog circuits (e.g., circuits to provide bias and reference levels) and digital circuits (e.g., image enhancement circuitry, line buffers to temporarily store lines of pixel values, register banks that control global device operation and/or frame format).

Figure 3A:
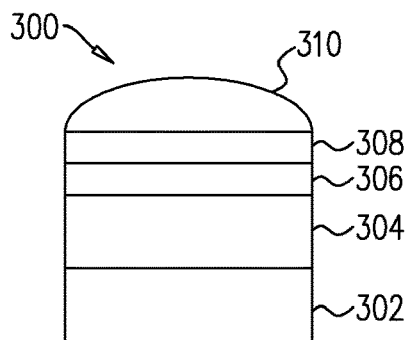
FIGS. 3A-3C are schematic sectional side views of example pixels of image sensors in accordance with embodiments of the invention.

FIG. 3A is a schematic cross-sectional side view of an example pixel 300, which may be used in the image sensors described herein (such as pixel array 202 of image sensor 200 described above in relation to FIG. 2). Pixel 300 may comprise a pixel circuitry layer 302 and a photosensitive material layer 304 overlying pixel circuitry layer 302. Pixel circuitry layer 302 includes pixel circuitry for applying control signals to and reading out charge collected from photosensitive material layer 304.

Photosensitive material layer 304 may be configured to absorb photons and generate one or more electron-hole pairs in response to photon absorption. In some instances, photosensitive material layer 304 may include one or more films formed from quantum dots, such as those described in U.S. Pat. No. 7,923,801, which is incorporated herein by reference in its entirety. The materials of photosensitive material layer 304 may be tuned to change the absorption profile of photosensitive material layer 304, whereby the image sensor may be configured to absorb light of certain wavelengths (or range of wavelengths) as desired. It should be appreciated that while discussed and typically shown as a single layer, photosensitive material layer 304 may be made from a plurality of sub-layers. For example, the photosensitive material layer may comprise a plurality of distinct sub-layers of different photosensitive material layers.

Additionally or alternatively, photosensitive material layer 304 may include one or more sub-layers that perform additional functions, such as providing chemical stability, adhesion or other interface properties between photosensitive material layer 304 and pixel circuitry layer 302, or for facilitate charge transfer across the photosensitive material layer 304. It should be appreciated that sub-layers of photosensitive material layer 304 may optionally be patterned such that different portions of the pixel circuitry may interface with different materials of the photosensitive material layer 304. For the purposes of discussion in this application, photosensitive material layer 304 will be discussed as a single layer, although it should be appreciated that a single layer or a plurality of different sub-layers may be selected based on the desired makeup and performance of the image sensor.

To the extent that the image sensors described here comprises a plurality of pixels, in some instances a portion of photosensitive material layer 304 may laterally span multiple pixels of the image sensor. Additionally or alternatively, photosensitive material layer 304 may be patterned such that different segments of photosensitive material layer 304 may overlie different pixels (such as an embodiment in which each pixel has its own individual segment of photosensitive material layer 304). As mentioned above, photosensitive material layer 304 may be in a different plane from pixel circuitry layer 302, such as above or below the readout circuitry relative to light incident thereon. That is, the light may contact photosensitive material layer 304 without passing through a plane (generally parallel to a surface of the photosensitive material layer) in which the readout circuitry resides.

In some instances, it may be desirable for photosensitive material layer 304 to comprise one or more direct bandgap semiconductor materials while pixel circuitry layer 302 comprises an indirect bandgap semiconductor. Examples of direct bandgap materials include indium arsenide and gallium arsenide, among others. The bandgap of a material is direct if a momentum of holes and electrons in a conduction band is the same as a momentum of holes and electrons in a valence band. Otherwise, the bandgap is an indirect bandgap. In embodiments in which pixel circuitry layer 302 includes an indirect bandgap semiconductor and photosensitive material layer 304 includes a direct bandgap semiconductor, photosensitive material layer 304 may promote light absorption and/or reduce pixel-to-pixel cross-talk, while pixel circuitry layer 302 may facilitate storage of charge while reducing residual charge trapping.

The pixel circuitry in pixel circuitry layer 302 typically comprises at least two electrodes for applying a bias to at least a portion of photosensitive material layer 304. In some instances, these electrodes may comprise laterally-spaced electrodes on a common side of the photosensitive material layer 304. In other variations, two electrodes are on opposite sides of the photosensitive material layer 304. In these variations, pixel 300 may comprise a top electrode 306 positioned over photosensitive material layer 304. In embodiments that include a top electrode, the image sensor is positioned within an imaging device such that oncoming light passes through top electrode 306 before reaching photosensitive material layer 304. Accordingly, it may be desirable for top electrode 306 to be formed from a conductive material that is transparent to the wavelengths of light that the image sensor is configured to detect. For example, top electrode 306 may comprise a transparent conductive oxide. In some instances, electrode 306 may span multiple pixels of an image sensor. Additionally or alternatively, electrode 306 optionally may be patterned into individual electrodes such that different pixels have different top electrodes. For example, there may be a single top electrode that addresses every pixel of the image sensor, one top electrode per pixel, or a plurality of top electrodes wherein at least one top electrode address multiple pixels.

In some instances pixel 300 may further comprise one or more filters 308 overlaying the photosensitive material layer 304. In some instances, one or more filters may be common to the pixel array, which may be equivalent to moving filter 106 of FIG. 1 into image sensor 102.

Additionally or alternatively, one or more of filters 308 may be used to provide different filtering between different pixels or pixel regions of the pixel array. For example, filter 308 may be part of a color filter array, such as a Bayer filter, CMY filter, or the like.

Additionally, in some variations the pixel 300 may comprise a microlens overlying at least a portion of the pixel. The microlens may aid in focusing light onto photosensitive material layer 304.

Figure 3B:
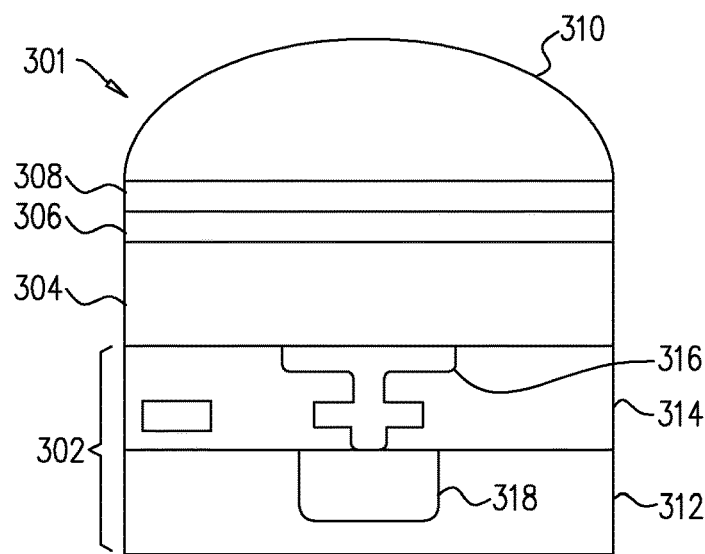

FIG. 3B is a schematic cross-sectional side view of a variation of a pixel 301, which shows a portion of pixel circuitry layer 302 in large detail. Common components to those described in FIG. 3A are labeled with the same numbers as in FIG. 3A. Pixel circuitry layer 302 can include a semiconductor substrate layer 312 and/or one or more metal layers (collectively referred to herein as metal stack 314) which collectively perform biasing, readout, and resetting operations of the image sensor. Semiconductor substrate layer 312 may include a semiconductor material or combination of materials, such as silicon, germanium, indium, arsenic, aluminum, boron, gallium, nitrogen, phosphorus, doped versions thereof. In one or more embodiments, semiconductor layer 312 includes an indirect-bandgap semiconductor (e.g., silicon, germanium, aluminum-antimonide, or the like). In instances in which the pixel circuitry comprises a metal stack 314, the metal layers may be patterned to form contacts, vias, or other conductive pathways which may be insulated by a dielectric such as $SiO_2$. It should be appreciated that metal stack 314 and the associated interconnect circuitry may be formed using traditional complementary metal-oxide semiconductor (CMOS) processes.

As shown in FIG. 3B, metal stack 314 may comprise a pixel electrode 316, which along with a second electrode (e.g., a laterally-spaced electrode or a top electrode 306) may provide a bias to the photosensitive layer during one or more operations of the image sensor. The metal layers may further form a via between metal stack 314 and semiconductor substrate layer 312 to provide a connection therebetween.

To facilitate the collection and transfer of charge within the pixel, one or more transistors, diodes, and photodiodes may formed in or on a semiconductor substrate layer 312, for example, and are suitably connected with portions of metal stack 314 to create a light-sensitive pixel and a circuit for collecting and reading out charge from the pixel. Pixel circuitry layer 302 may facilitate maintaining stored charges, such as those collected from the photosensitive layer. For example, semiconductor substrate layer 312 may comprise a sense node 318, which may be used to temporarily store charges collected from the photosensitive layer. Metal stack 314 may comprise first interconnect circuitry that provides a path from pixel electrode 316 to sense node 318. While metal stack 314 is shown in FIG. 3B as providing a direct pathway between pixel electrode 316 and sense node 318 without intervening circuitry, it should be appreciated that in other instances (such as in circuitry described below with reference to FIG. 4B), one or more intervening circuit elements may be positioned between the pixel electrode 316 and the sense node 318.

Figure 3C:
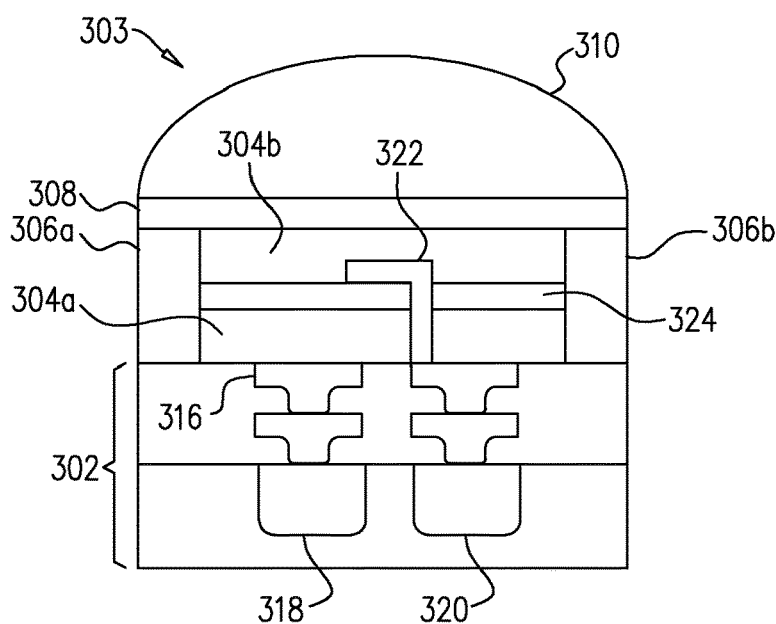

FIG. 3C shows another variation of a pixel 303, which is similar to pixel 301 of FIG. 3B (with common components from FIG. 3B labeled with the same numbers), except that pixel 303 comprises a plurality of separate photosensitive layers, which may each provide electrical signals. As shown in FIG. 3C, pixel 303 may comprise a first photosensitive layer 304a and a second photosensitive layer 304b overlying first photosensitive layer 304a. An insulating layer 324 may separate first photosensitive layer 304a from second photosensitive layer 304b, such that each photosensitive layer may be independently biased. Accordingly, pixel 303 may comprise a plurality of electrodes to provide a respective bias to each of first photosensitive layer 304a and second photosensitive layer 304b. For example, in the variation shown in FIG. 3C, pixel 303 may comprise a first electrode 316 connected to first photosensitive layer 304a, a second electrode 322 connected to second photosensitive layer 304b, and one or more common electrodes (shown as two electrodes 306a and 306b, although these electrodes may be combined into a single electrode) connected to both the first and second photosensitive layers around at least a portion of the periphery of pixel 303.

To reach second photosensitive layer 304b, at least a portion of second electrode 322 may pass through a portion of first photosensitive layer 304a and insulating layer 324. This portion of second electrode 322 may be insulated to insulate the second electrode from first photosensitive layer 304a. A first bias may be applied to first photosensitive layer 304a via first electrode 316 and the common electrodes, and a second bias may be applied to second photosensitive layer 304b via second electrode 322 and the common electrodes. While shown in FIG. 3C as sharing one or more common electrodes, the first and second photosensitive layers need not share any electrodes. For example, the first and second photosensitive layers (and corresponding electrodes) may be configured in any suitable fashion, such as those described in U.S. Patent Application Publication 2016/0155882 the contents of which are incorporated herein by reference in their entirety.

Each photosensitive layer may be connected to the pixel circuitry in such a way that the photosensitive layers may be independently biased, read out, and/or reset. Having different photosensitive layers may allow the pixel to independently read out different wavelengths (or wavelength bands) and/or read out information with different levels of sensitivity. For example, first photosensitive layer 304a may be connected to a first sense node 318 while second photosensitive layer 304b may be connected to a second sense node 320, which in some instances may be separately read out to provide separate electrical signals representative of the light collected by the first and second photosensitive layers respectively.

Figure 4A:
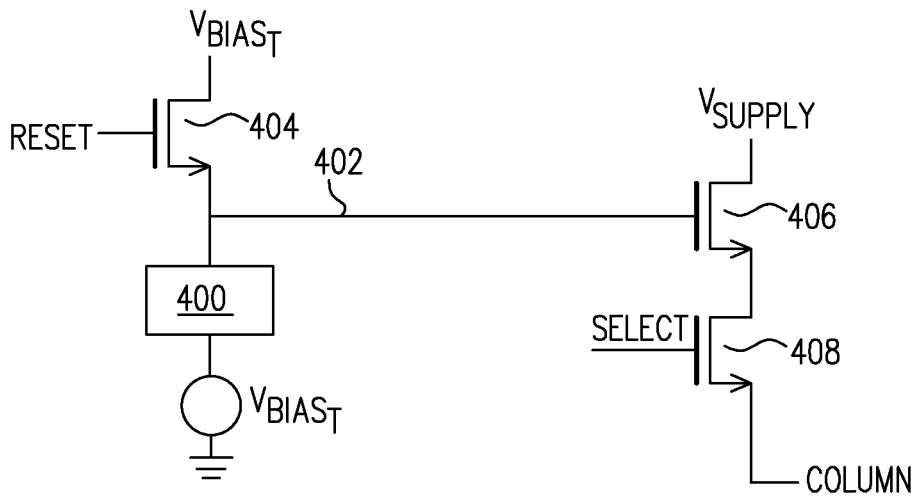
FIGS. 4A and 4B are electrical circuit diagrams that schematically illustrate pixel circuits in an image sensor, in accordance with embodiments of the invention.
Figure 4B:
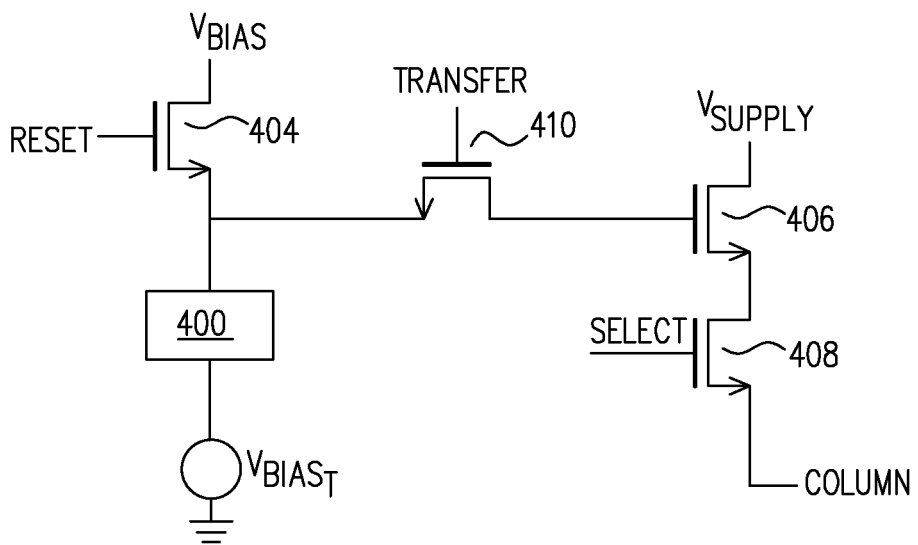

FIGS. 4A and 4B show example pixel circuitry which may be used to bias, read out, and reset individual pixels. While FIG. 4A shows a three transistor (3T) embodiment and FIG. 4B shows a four transistor (4T) embodiment, it should be appreciated that these are just exemplary circuits and any suitable pixel circuitry can be used to perform these operations. For example, suitable pixel circuitry embodiments are described in US Patent Application Publications 2017/0264836, 2017/0208273, and 2016/0037114, the contents of each of which are incorporated herein by reference in their entirety.

Turning to FIG. 4A, the pixel circuitry may be configured to apply a first bias potential $V_{BiasT}$, which may be applied to photosensitive layer 400 (e.g., via a first electrode such as a top electrode as discussed above). Photosensitive layer 400 may also be connected to a sense node 402 (e.g., via a pixel electrode such as discussed above). Sense node 402 may be connected to a second bias potential $V_{BiasB}$ via a reset switch 404 (which is controlled by a reset signal RESET). Reset switch 404 may be used to reset sense node 402 at various points during operation of the image sensor. The pixel circuit of FIG. 4B is identical to that of FIG. 4A, except that in FIG. 4B the pixel circuit includes a transfer switch 410 positioned between photosensitive layer 400 and the sense node. The transfer switch may be used to facilitate transfer of charge between photosensitive layer 400 and the pixel output.

Sense node 402 may further be connected to an input of a source follower switch 406, which may be used to measure changes in sense node 402. Source follower switch 406 may have its drain connected to a voltage source $V_{SUPPLY}$ and its source connected to a common node with the drain of a select switch 408 (controlled by a select signal SELECT). The source of select switch 408 is in turn connected to an output bus COLUMN. When select switch 408 is turned on, changes in sense node 402 detected by follower switch 406 will be passed via select switch 408 to the bus for further processing.

The image sensors described here may be configured to read out images using rolling shutter or global shutter techniques. For example, to perform a rolling shutter readout using the pixel circuitry of FIG. 4A, a first reset may be performed to reset the sense node prior to integration. Reset switch 404 may be opened to reset sense node 402 to the second potential $V_{BiasB}$. Closing reset switch 404 may initiate an integration period, during which one or more measurements may be taken to measure the potential of sense node 402 (which may vary as the photosensitive layer absorbs light). A second reset may end integration. The period between the second reset and the first reset of a subsequent frame may depend on the frame readout rate.

Similarly, the pixel circuitry of FIG. 4A may adjust the first potential $V_{BiasT}$ to achieve a global shutter operation. In these instances the first potential $V_{BiasT}$ may be driven at a first level during integration and at a second level outside of integration. The second level of the first potential $V_{BiasT}$ may be selected such that charges generated in the photosensitive material are not collected by the pixel electrode. A first reset may be used to reset the pixel electrode and sense node to the second potential $V_{BiasB}$ at the start of integration. During integration (which may occur simultaneously across multiple rows of the image sensor), the sense node potential may change based on the amount of light absorbed by photosensitive layer 400. After integration, the first potential $V_{BiasT}$ may be returned to the second level, and the charge on the sense node may be read out. A second reset may again reset the sense node to the second potential, and a second reading of the sense node may be read out. The multiple readings can be used, for example, in a correlated double sampling (CDS) operation.

Mitigation of Artifacts Due to Selective Readout

Figure 5:
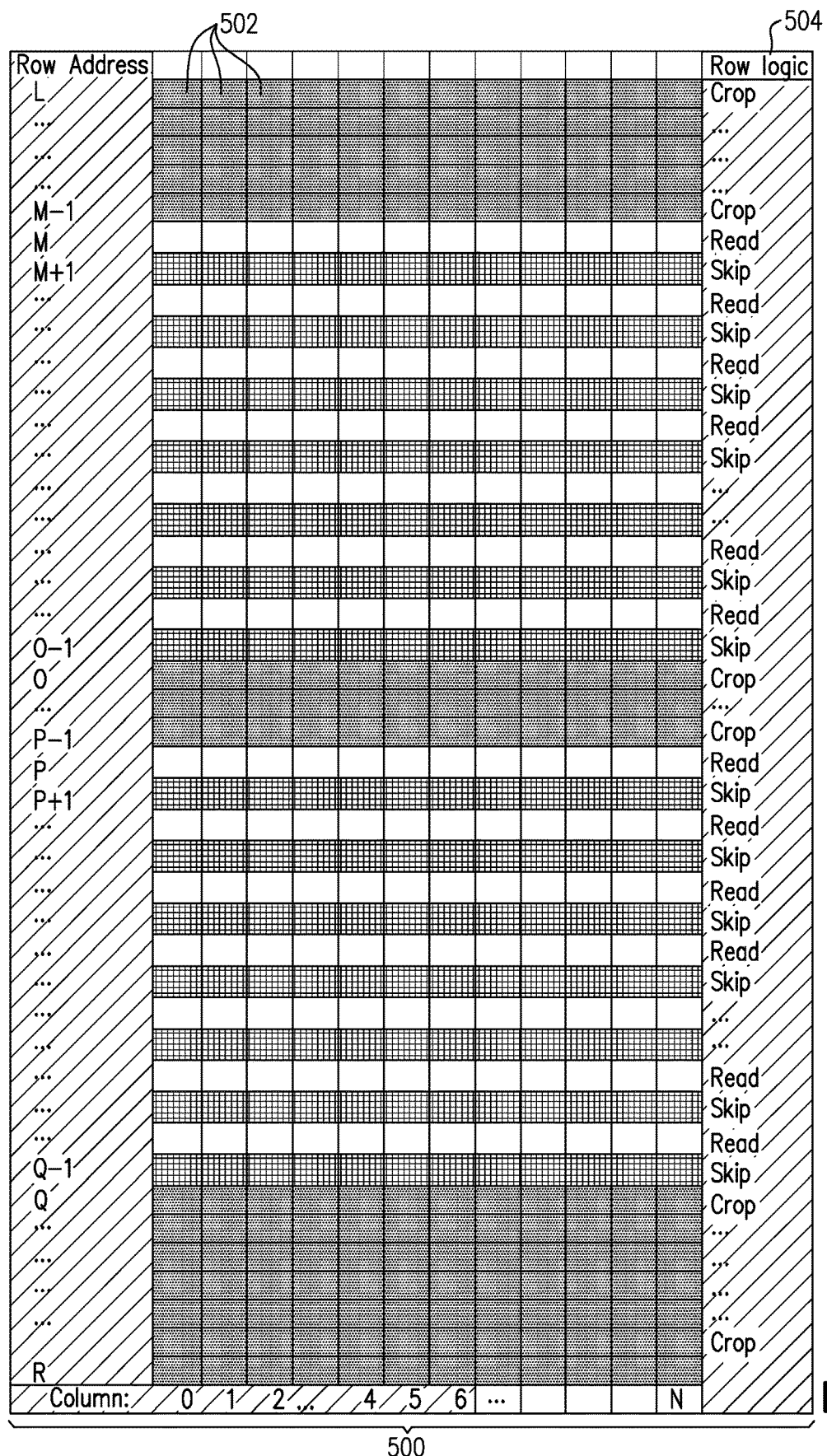
FIG. 5 is a schematic top view of an image sensor with selective readout capability, in accordance with an embodiment of the invention.

FIG. 5 is a schematic top view of an image sensor 500 with selective readout capability, in accordance with an embodiment of the invention. Image sensor 500 comprises a photosensitive medium, such as a quantum film, along with an array of pixel circuits on a semiconductor substrate, as illustrated in the preceding figures. These pixel circuits define an array of pixels 502, which are arranged in a matrix of rows and columns. In this and other figures, the rows extend horizontally across the array, while the columns extend vertically, but this designation of "rows" and "columns" is arbitrary and is used solely for the sake of simplicity and clarity of explanation. The pixel circuits apply control signals to and read out photocharge from respective areas of the photosensitive medium. For this purpose, row logic 504 applies control signals to the pixels in each row in order to reset and read out the photocharge from the photosensitive medium as shown and described above.

Image sensor 500 is capable of selective readout, meaning that certain rows or windows comprising multiple rows are read out during a given image frame, while the remaining rows are cropped out or skipped over. For this purpose, a control circuitry (for example, control circuitry 208 in FIG. 2) programs row logic 504 to select a first set of rows of the pixel circuits, referred to as the active rows, to read out the photocharge from the respective areas of the photosensitive medium in a given image frame. Meanwhile, the accumulated photocharge is not read out during the given image frame by the pixel circuits in a second, remaining set of the rows, referred to as the skipped and cropped rows, which is disjoint from the first set. (The term "disjoint" is used in this context in accordance with its conventional mathematical meaning, to indicate that the first and second sets have no rows in common.) For example, the first set of rows can define a cropping window, comprising multiple rows of the array belonging to the first set, while multiple consecutive rows in the second set are outside the cropping window. Additionally or alternatively, at least some of the rows in the first and second sets are sequentially interleaved in the matrix of pixels.

Although FIG. 5 shows alternating patterns of single read rows with single skipped rows (one such pattern beginning in row M and another in row P), other alternation patterns are also possible. For example, in a color image sensor, row logic 504 may be programmed to read alternating pairs of rows (two read rows followed by two skipped rows, and so forth). As another example, rather than subsampling the rows in a ratio of 1:2, as shown in FIG. 5, the rows may be subsampled at lower resolution, in which two, three or more rows are skipped for every row that is read out.

In image sensors that are known in the art, all the rows that are read out go through same reset process. If the sensor is programmed to be subsampled (i.e., to skip over rows at readout), however, or if it is programmed to read out only a cropped region, then the rows that are skipped or cropped do not go through this regular reset process. In such cases, pixels of the photosensitive medium can subsequently exhibit a difference in their dark current or response, or both, depending on whether they were previously read by an active row, including the regular reset, or were previously read by a row that was skipped over and therefore not reset. This difference can then undesirably appear in the image when the sensor is switched from sub-sampling to regular mode, or from cropped to full-frame.

To avoid this sort of artifacts, row logic 504 in the present embodiment is programmed to control the pixel circuits so that in any given frame, all of the pixel circuits in both the active and skipped rows apply reset signals to their respective areas of the photosensitive medium. The pixel circuits in the active rows apply both these reset signals and sampling signals in order to read out the accumulated photocharge in the given frame. In the skipped rows, however, only the reset signals need be applied.

More specifically, in an example embodiment, row logic 504 has the following characteristics:

1. Row logic 504 resets every row (including the skipped and cropped rows) of the pixel array in the same way as the active rows.

2. This additional reset for the skipped and cropped rows can be very fast, as the pixels in these rows are not sampled (i.e., these rows are not read out), and therefore no settling of the signals from these rows is required for accurate digitization. The use of a fast reset can reduce the impact on row time and thus increase the attainable frame rate.

3. The reset of skipped rows in sub-sampling mode can be synchronized with the reset and readout of the adjacent active rows, which means that unused rows are reset just before the adjacent row begins the read phase.

4. The top and bottom cropped rows can be reset at a different time (frame rate permitting) or in parallel with the readout of active rows.

5. As long as the number of active rows is larger than the number of skipped and cropped rows, the skipped and cropped rows can be reset without substantial impact on the frame rate of image sensor 500. Otherwise, when there is a larger number of skipped and cropped rows than active rows, the need to reset the skipped and cropped rows may cause a reduction in the frame rate.

Figure 6:
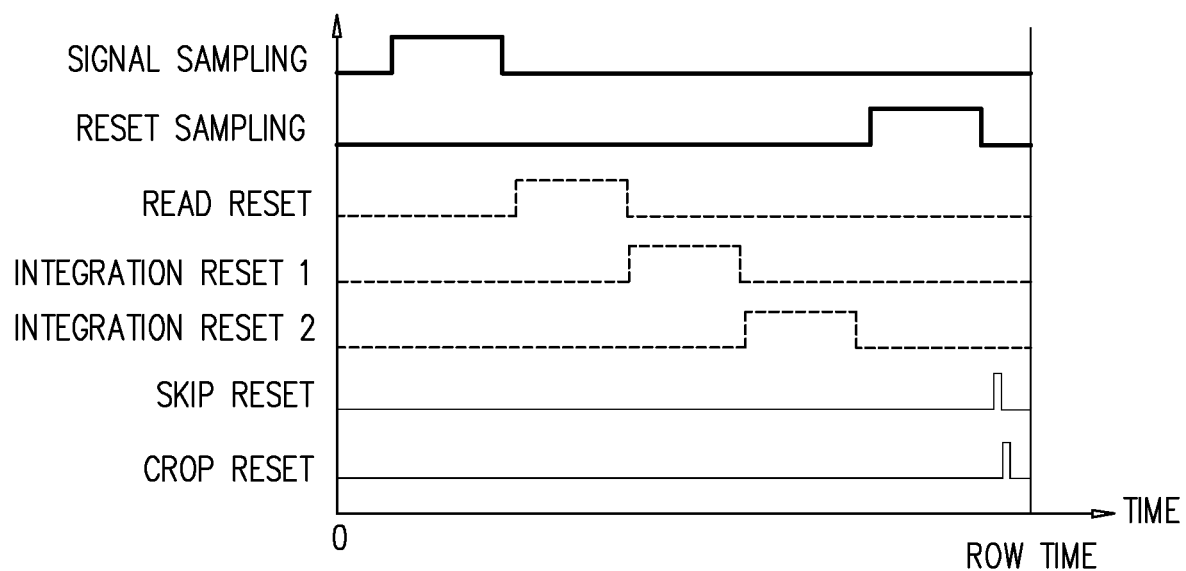
FIGS. 6 and 7 are timing diagrams, which schematically illustrate timing signals applied by row logic in an image sensor, in accordance with embodiments of the invention.
Figure 7:
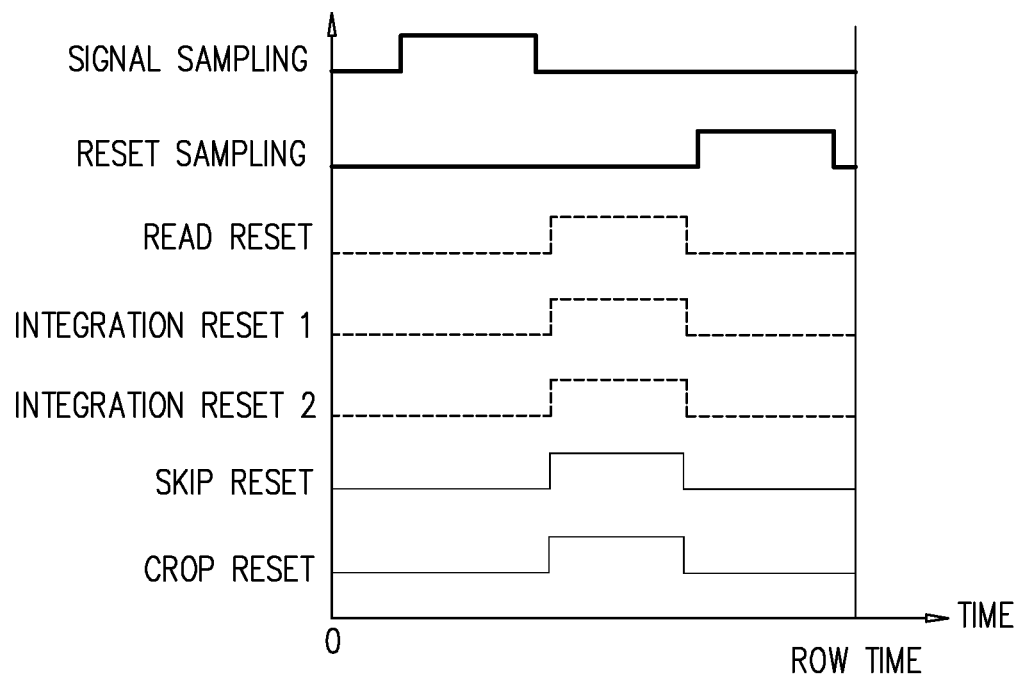

FIGS. 6 and 7 are timing diagrams, which schematically illustrate possible timing signals applied by row logic 504, including skip and crop reset in two different modes of operation:

FIG. 6 shows a serial reset mode, in which a maximum of one row is reset at any given time. The skip and crop resets are added sequentially in time with application of the reset signals to the active rows, after the integration reset signals. These sequential resets will increase the row time slightly (thus reducing frame rate). Since the pixels in the skipped and cropped rows are never read out, however, it is possible to perform a pixel reset in these rows of very short duration relative to the reset in the active rows, as explained above. The impact on row time will therefore be minimal as illustrated in FIG. 6.

FIG. 7 shows a parallel reset mode, in which some or all of the resets are applied simultaneously, in both the active rows and the rows that are skipped and cropped. In this configuration, the skip and crop resets do not add to the row time, so that there is no increase in the frame rate. In this case, however, the reset circuitry in row logic 504 should have enough driving capability to be able to reset a larger number of rows simultaneously, for instance resetting five rows in the example shown in FIG. 7 in the same amount of time that it would have taken to reset just the three active rows.

Referring back to the example shown in FIG. 5, image sensor 500 is programmed in accordance with the following readout format:

a. Crop out rows from L to M−1, from O to P−1, and from Q to R.

b. Read rows M, M+2, . . . O−2, P, P+2, . . . Q−2. Rows M, M+2, . . . O−2 may be dark read rows, containing optically black pixels, which are read out in each frame and used for dark level calibration).

c. Skip rows M+1, M+3, . . . O−1 and P+1, . . . Q−1.

The above read, skip and crop regions are programmable and may be modified by control circuitry 208 from frame to frame. The programming may be carried out, for example, by setting appropriate row address pointers or flags, which instruct row logic 504 regarding which rows are to be read out, and which are to be skipped or cropped.

Figures 8, 9:
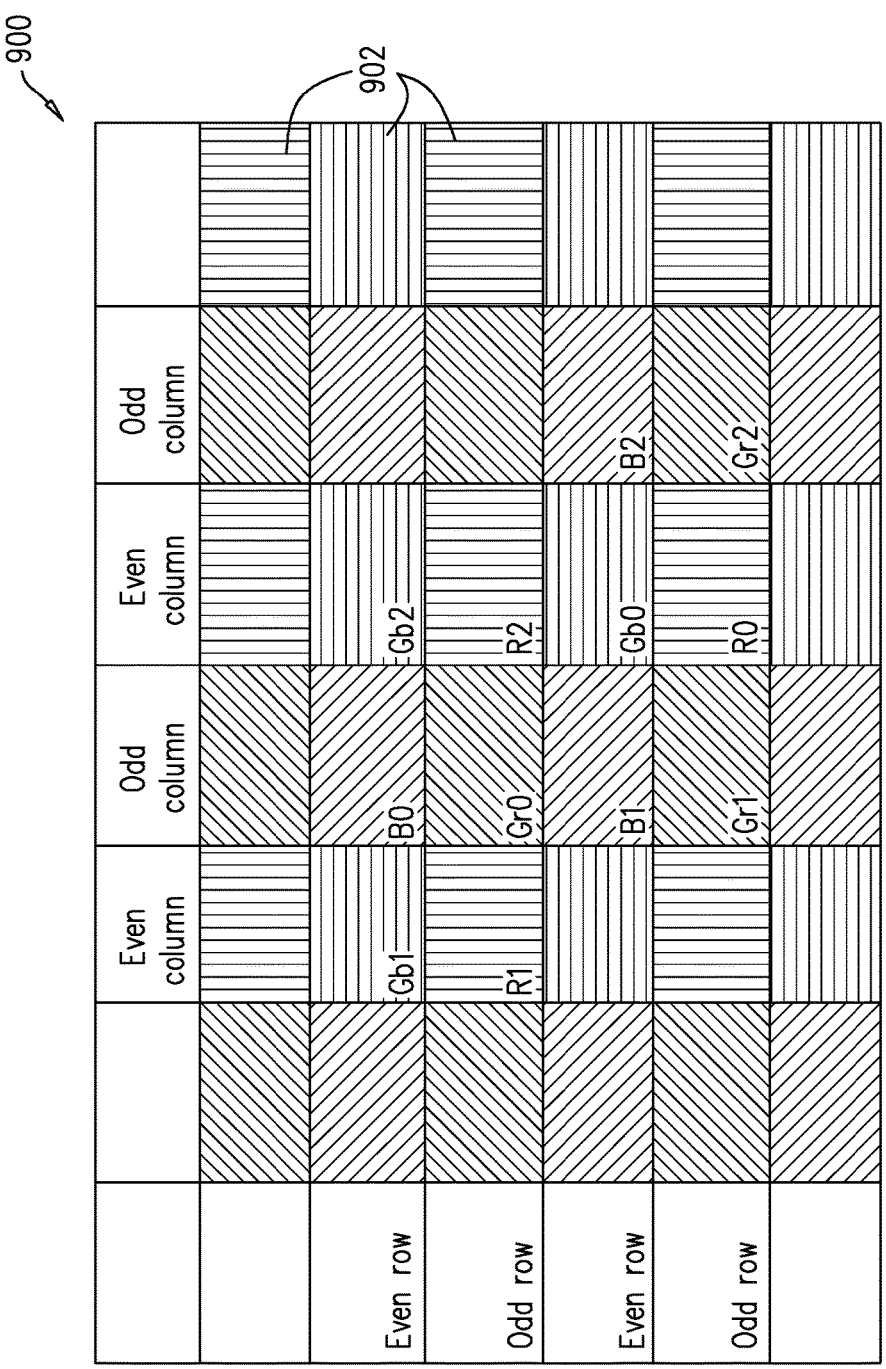
FIG. 8 is a table showing a flow of pointers used in controlling row logic in an image sensor, in accordance with an embodiment of the invention.
FIG. 9 is a schematic top view of a color image sensing array, illustrating a method for correction of crosstalk in accordance with an embodiment of the invention.

FIG. 8 is a table showing a flow of pointers used in controlling row logic 504, in accordance with an embodiment of the invention. Each column in the table show the address of the read, skip, and crop pointers at a given row time. At each row time, the pointers are advanced from one column in the table to the next. Thus, during the first row time, the read pointer address is M, the skip pointer address is M+1, and the crop pointer address is L. At the next row time, the pointer addresses are advanced to M+2, M+3 and L+1, respectively, and so forth. Row logic 504 applies the row reset and readout signals in accordance with the pointer locations at each row time. When a pointer has finished going through all the rows of its type, it holds at a corresponding parking address until the next frame starts. The last column in the table represents the vertical blanking period.

The above schemes are shown and described by way of illustration, and row logic 504 may alternatively be designed and programmed in other ways that still provide the desired reset of unread rows. The number of cropped and skipped regions can be programmable to include dark, active or any other type of rows.

Additionally or alternatively, the numbers of skip and crop pointers can be greater than one of each and may be programmable, as well. Thus, for example, if the number of read rows is less than the number of unused cropped rows, and frame rate is a concern, then the number of crop pointers could be increased so that all unused cropped rows will have been reset by the time the read pointer finishes traversing all the read rows. As another example, if the subsampling ratio is greater than 1:2, the number of skip pointers could be increased to match the additional number of skipped rows that are to be reset for each active row. Thus, for 1:3 subsampling, there could be two skip pointers. When only cropping or only subsampling (row skipping) is used, it is possible to enable only the crop pointer or only the skip pointer, but not both.

The direction of movement of the pointers could be from bottom to top (vertical flip mode), rather than top to bottom as shown in FIG. 8. Alternatively, the pointers could start from the top and bottom and converge to the middle of the array.

As yet another option, the duration of the reset pulses can vary among different rows and regions. This variation can be used to compensate for response variations between regions, including those due to material variations or use of different types of optically-sensitive material on the image sensor. For high dynamic range (HDR) image sensors, the pulse durations can vary between the rows corresponding to different integration times in order to compensate for any difference in the response of these row types when switching from subsampled HDR to non-HDR modes.

Mitigating Crosstalk Between Adjacent Pixels

In film-based image sensors, there is a stack of metal layers connecting the photosensitive medium with the pixel circuit in each pixel, for example as shown above in FIGS. 3B and 3C. These metal stacks can be sensitive to electrical crosstalk between the metal stacks in adjacent pixels and between the metal stacks and pixel readout lines. This electrical crosstalk is dependent on the size and geometry of the metal layers, as well as on light intensity. It can result in undesirable phenomena such as color casting, color hashing, and gain mismatch between different columns of the sensor array.

In some embodiments of the present invention, control circuitry in or associated with the image sensor, such as control circuitry 208 shown in FIG. 2, applies a correction to each pixel based on the signal levels of one or more neighboring pixels in order to cancel out the effect of this crosstalk. In other words, as the control circuitry receives signals from the pixel circuits in the image sensor, corresponding to the photocharge read out from respective areas of the photosensitive medium, and converts the signals to respective pixel output values, it corrects for crosstalk of the photocharge from neighboring areas of the photosensitive medium. This correction is typically applied digitally, row by row, after digitizing the signals from the image sensor, but it may alternatively be applied, in either digital or analog circuits, at other points in the processing pipeline.

FIG. 9 is a schematic top view of a color image sensing array 900, illustrating the present method for correction of crosstalk, in accordance with an embodiment of the invention. In this example, a color filter array overlies the photosensitive medium (such as a quantum film, as shown in the preceding figures) of array 900 and defines pixels 902 of different colors in the corresponding areas of the photosensitive medium. In the present embodiment, the control circuitry corrects the respective pixel output values for each given color for the crosstalk from the neighboring pixels of a different color.

Thus, in the pictured example:
Pixels in even rows of even columns are denoted $Gb_i$.
Pixels in even rows of odd columns are denoted $B_i$.
Pixels in odd rows of odd columns are denoted $R_i$.
Pixels in odd rows of even columns are denoted $Gr_i$.
Here i is an integer number. Furthermore, as shown in the figure:
B0, Gb0, R0 and Gr0 are the pixels to be corrected for crosstalk.
Gb1, Gb2, B1, B2, R1, R2, Gr1 and Gr2 are the left and right neighbors of the above pixels, i.e., the preceding and succeeding pixels 902 in readout of the respective rows from array 900.
B0', Gb0', R0' and Gr0' are the new pixel output values after correction The control circuitry corrects for crosstalk by reducing each of the output values from array 900 by an amount proportional to the photocharge read out from either a preceding pixel, a succeeding pixel, or both, along a row of array 900. For this purpose, the control circuitry can store a table of weighting coefficients. The control circuitry then reduces the output value of each pixel by multiplying the signals received from the preceding and/or succeeding pixel by the weighting coefficients to give a weighted correction, and subtracting the respective weighted correction from each pixel signal. The weighting coefficients may have fixed values, or they may alternatively vary as a function of the signals received from the preceding and/or succeeding pixels in order to compensate for nonlinear effects.

Referring to FIG. 9 and the pixel definitions listed above, the corrected pixel output values are computed as follows:

$$B0' = e \cdot B0 - b1 \cdot Gb1 - b2 \cdot Gb2$$

$$Gb0' = e \cdot Gb0 - a1 \cdot B1 - a2 \cdot B2$$

$$Gr0' = o \cdot Gr0 - d1 \cdot R1 - d2 \cdot R2$$

$$R0' = o \cdot R0 - c1 \cdot Gr1 - c2 \cdot Gr2$$

Typically, the coefficients a1, a2, b1, b2, c1, c2, d1 and d2 are floating point numbers in the range [0,1], and o and e are floating point numbers in range [1, +infinity] (although in practice, o and e are generally limited to the range [1,2]).

Alternatively, a one-sided crosstalk correction may be applied, in which each pixel is considered to be affected only by its predecessor or follower. In this case, only the left neighbor may be used (i.e., b2=a2=d2=c2=0) or only the right neighbor (i.e., b1=a1=d1=c1=0). Alternatively, the crosstalk correction may be pairwise, so that the left pixel in each pixel pair is used to correct the right pixel, and the right pixel of the pair is used for correcting the left pixel (in which case b1=a2=d1=c2=0).

Typically, the above corrections are implemented in hardware logic. The one-sided approach (particularly using pairwise correction) has advantages of lower power consumption and gate count. The inventors have found that the coefficients can be represented with sufficient precision using a two-bit value for the integer part and an eight-bit value for the decimal part of the coefficients. To economize the logic still further, the coefficients o and e can be fixed at the value 1, and integer part of the remaining coefficients can be fixed at 0.

The above corrections work for both color and monochrome sensors, as well as both visible and infrared sensors, though typically with different values of the coefficients.

Nonlinear crosstalk can be handled using a piecewise-linear lookup table to model the intensity-dependent coefficients. In this case, the control circuitry will read out and use the closest coefficient corresponding to sensed signal level of the neighboring pixel. Such a lookup table can be self-calibrating, with reprogramming of the coefficient values by the control circuitry. Alternatively, the crosstalk coefficient for different intensity settings can be preprogrammed in memory for each image sensor, for example using a one-time programmable (OTP) memory.

Mitigating Crosstalk Between Adjacent Rows

In film-based image sensors, such as those described above, there is capacitive coupling between the sense nodes of adjacent rows of the pixel array. When operating in a rolling shutter mode, the pixel circuits apply control signals to and read out photocharge from respective areas of the photosensitive medium (such as a quantum film) in a rolling sequence over the rows of the array. In other words, while pixels in the same row have the same timing, the reset and readout signals applied to pixels in each successive, neighboring row are shifted by one row time ($\Delta T_{row}$), typically on the order of 10 as, relative to the preceding row.

Each pixel in a given row j integrates photocharge at a time that starts when a pulsed integration reset signal (RST2) is applied to the sense nodes of the pixels in the row, and then reads out the integrated charge subsequently upon application of a readout signal, which again resets the pixels (RST1). The integration reset pulse RST2 of the next row j+1 is typically applied during the integration interval between RST2 and RST1 for row j. RST2 in row j+1 can cause a sharp jump in the voltage on the sense node of the pixel in row j+1, by as much as several volts, which couples capacitively into the sense node of the neighboring pixel in row j during its integration interval. This crosstalk can cause significant deviations in the readout voltage of the neighboring pixel, particularly when short integration times are used.

The present embodiment resolves this crosstalk problem by modifying the row control logic (for example, row circuitry 204 in FIG. 2 or row logic 504 in FIG. 5) to enable application of an additional lock signal (RST3) in each image frame: Prior to the integration reset signal RST2, the RST3 lock signal is applied to gate 404 (FIGS. 4A/B) to set and hold the photosensitive medium at the baseline voltage for at least one row time. (This lock signal is applied before or currently with the integration reset signal in the preceding row of the array.) The reset signal RST2 then follows the lock signal, and releases the photosensitive medium from the baseline voltage, thereby initiating integration of the photocharge by the pixel circuit. The readout signal RST1 follows the reset signal, and switches the photocharge that has been integrated out of the array.

Figure 10:
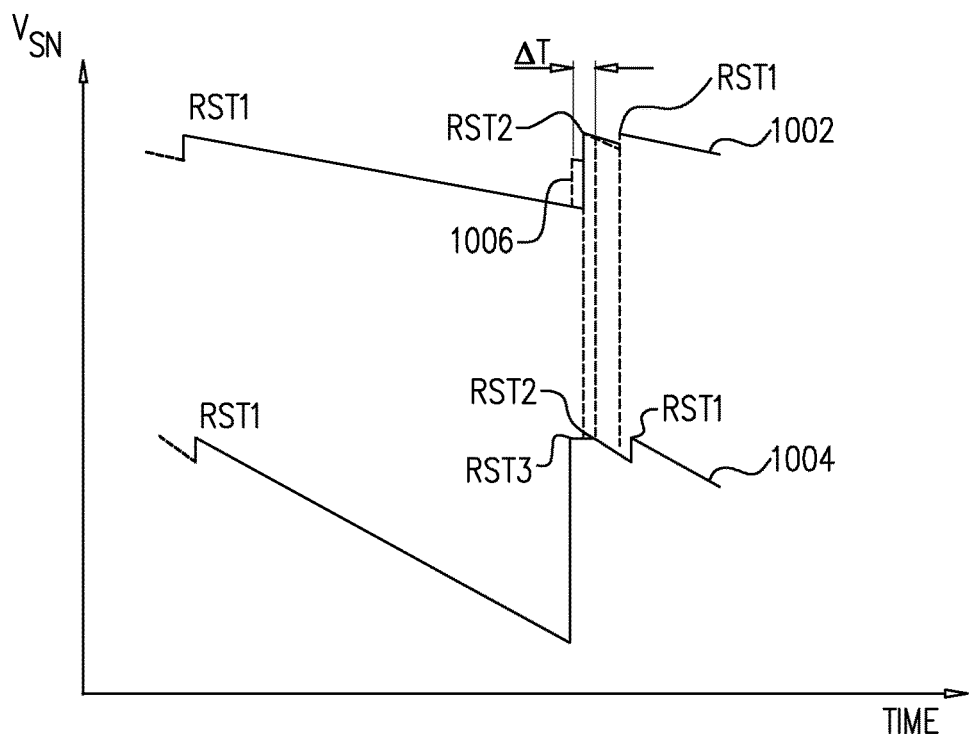
FIGS. 10 and 11 are plots of voltage at the sense nodes of two pixels in an image sensor, illustrating the use and effect of a reset lock signal in accordance with embodiments of the invention.

FIG. 10 is a plot of voltage at the sense nodes ($V_{SN}$) of two pixels in an image sensor, illustrating the use and effect of a reset lock signal in accordance with an embodiment of the invention. The voltage at the sense node of a given pixel in one row is shown by an upper curve 1002, while that of the neighboring pixel in the next row down in the array is shown by a lower curve 1004. The image sensor is assumed to be an electron-accumulation sensor, so that the voltage on the sense nodes drops following reset. The reset and readout signals (RST2 and RST1) occur in curve 1004 exactly one row time later than in curve 1002. To illustrate the effect of the lock signal RST3, this lock signal is shown only in curve 1004, although normally the lock signal could be applied to all rows.

In the pictured example, the pixels circuits operate at a short integration time (i.e., the timespan between RST2 and RST1 is small compared to the time from RST1 to the next RST2), and the lower pixel accumulates photocharge at a much faster rate than the upper pixel (e.g., due to a higher rate of incident photons from a bright object). Consequently, the lower pixel experiences a large voltage swing when reset, resulting in a crosstalk artifact 1006 in curve 1002. If this artifact were to occur during the integration time between RST2 and RST1 in curve 1002, it would result in a substantial change in the signal read out from the upper pixel.

In the present embodiment, however, the lock signal RST3 is applied to the lower pixel prior to the reset signal RST2 of the upper pixel, and thus prior to the beginning of the integration time of the upper pixel. The time span between the lock signal RST3 and the reset signal RST2 applied to the lower pixel, $\Delta T$, is sufficient to ensure that crosstalk artifact 1006 will occur prior to the beginning of the integration time at the upper pixel, so that the crosstalk is essentially zeroed out by application of the reset signal RST2 to the upper pixel.

Figure 11:
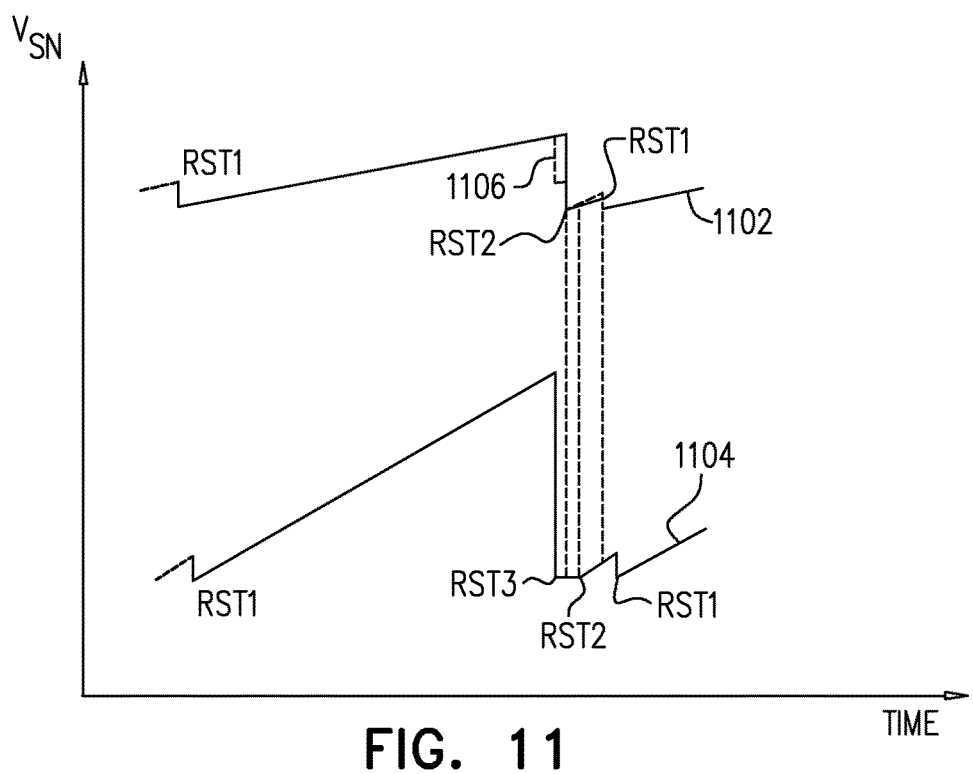

FIG. 11 is a plot illustrating the use and effect of the reset lock signal in a hole-accumulation image sensor, in accordance with another embodiment of the invention. The operation and effect of the reset lock signal RST3 is the hole-accumulation sensor is similar to that in the electron-accumulation sensor of FIG. 10, except that the directions of voltage change are reversed. In FIG. 11, the voltage at the sense node of the current pixel is shown by an upper curve 1102, while that of the neighboring pixel in the next row down in the array is shown by a lower curve 1104, with a crosstalk artifact 1106.

Various modes of implementation of the reset lock signal are possible. For example, a system of pointers could be used in controlling row logic 504, in the manner described above with reference to FIG. 8. The row time for the image sensor will then comprise a read phase defined by a corresponding read pointer, one or more reset phases with corresponding reset pointers, and one or more additional reset lock pointers, which will hold each row in reset before the integration reset for that row, as explained above. The lock reset is disabled just before the integration reset of the row. The number of row times over which a particular row can be held in reset is programmable, so that lock-based crosstalk mitigation can extend over two or more adjacent rows. To avoid bright light lag, however, the voltage at the sense node should be held at the baseline for no more than the minimum duration necessary, meaning that the optimal number of row times during which pixels should be locked is two in most circumstances.

To prevent static bands in the image output by the image sensor, it is desirable that the circuit activity be same for all rows. For this purpose, the lock pointer can be run in the same way in the vertical blanking rows of the array as in the active rows. In the pointer-based implementation of the row logic that is described above, the lock pointer can run through the parking rows (typically including two or more such rows) during vertical blanking.

The row logic in each row receives one lock pointer for each integration reset pointer. Thus it is possible to define multiple integration periods for each row in a given frame. Each integration period is initiated by a corresponding lock signal, followed by a reset signal, with timing selected so as to avoid crosstalk with the preceding row or rows in each one of the integration periods. The timing of lock and reset signals can also be adapted to configurations in which the pixels of the image sensor are sub-sampled (skipping pixels or rows of pixels) or binned together.

In some embodiments, it can be advantageous to perform a so-called "hard/soft reset" operation, in which pixels are first flushed to a voltage significantly below supply (VDDA), after which the reset transistor is brought into the subthreshold regime in order to achieve lower kTC noise. In this case, locked pixels undergo a sequence of "hard/soft" resets (one per row in parallel mode or three per row in serial modes), and it can be advantageous to first unlock the pixels and then perform a regular pixel reset similar to the one performed by the read pointer.

Other embodiments are applicable to schemes of pixel noise reduction that make use of a feedback circuit, which directly drives the pixel during reset in order to suppress noise fluctuations. To facilitate these types of noise cancellation techniques, only the current pixel is read out to the column bus (which is used by the feedback circuit as an input), and the lock row operation is performed with the locked rows disconnected from the column bus (i.e., select transistor off, as illustrated in FIGS. 4A/B, for example).

Efficient Implementation of Optical Black Pixels

As noted earlier in reference to FIG. 2, image sensor 200 comprises an optically black area, referred to as an obscured region 210, in which pixels 212 do not receive light. In image sensors that are known in the art, an optically-opaque layer, such as an organic black layer, is deposited over these pixels in order to block incident light. Control circuitry 208 uses the signals from these pixels in dark current compensation and correction of fixed pattern noise.

Figure 12:
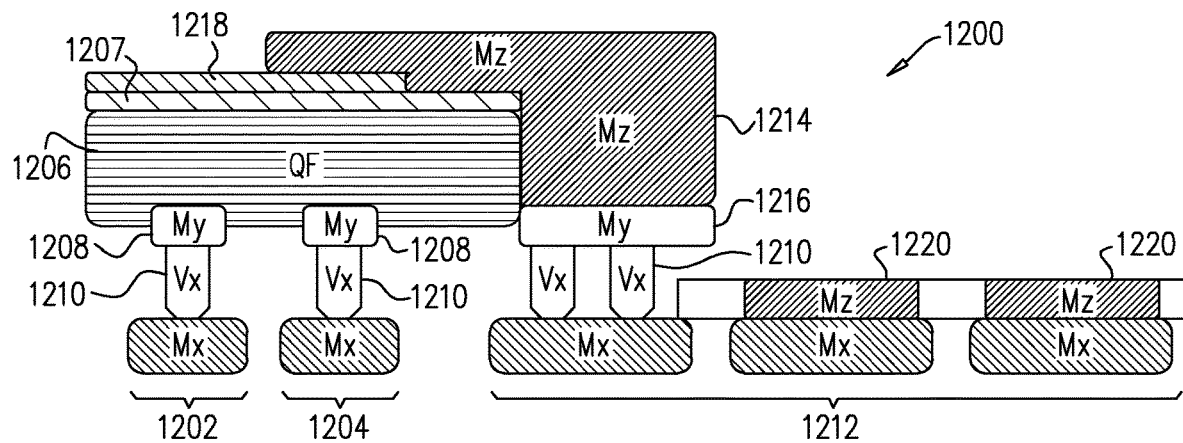
FIG. 12 is a schematic sectional view of a part of an image sensor, showing an optically black area formed in accordance with an embodiment of the invention.

FIG. 12 is a schematic sectional view of a part of an image sensor 1200, showing a more efficient implementation of such an optically black area, in accordance with an embodiment of the invention. Image sensor 1200 comprises a semiconductor substrate and an array of pixel circuits, arranged in a matrix on the semiconductor substrate and defining respective pixels, as shown in the preceding figures. In FIG. 12, pixel circuits 1202 and 1204 in metal layer Mx define a light sensing pixel and a black pixel, respectively. Pixel circuits 1202 and 1204 are connected by vias 1210 to respective pixel electrodes 1208, formed in metal layer My. Pixel electrodes 1208 contact a photosensitive film 1206, such as a quantum film, formed over the pixel electrodes. A common electrode 1207, which is at least partially transparent, is formed over photosensitive film 1206.

Control circuitry 1212 applies a bias to common electrode 1207 via intervening contacts 1216 and an opaque metallization layer 1214, which makes ohmic contact with the common electrode. Opaque metallization layer 1214 is formed in metal layer Mz and extends over photosensitive film 1206 on the pixels of image sensor 1200 that are designated as black pixels, such as the pixel defined by pixel circuit 1204 in FIG. 12. Opaque metallization layer 1214 thus serves the dual purposes of applying the electrical bias to common electrode 1207 and optically blocking light from reaching the black pixels. This dual use of layer 1214 reduces the number of process steps needed to produce image sensor 1200. A buffer layer 1218 covers part of common electrode 1207 (as shown in the figure), or may extend over the entire surface of the common electrode.

Control circuitry 1212 receives signals from pixel circuits 1202, 1204, . . . , due to photocharge accumulated by pixel electrodes 1208 in response to application of the bias on common electrode 1207, and converts the received signals to respective pixel output values. The control circuitry corrects the black level of the output values using the signals received from the black pixels, over which opaque metallization layer 1214 is formed, as a reference. This same opaque metallization layer, labeled Mz, may be further patterned to serve other purpose, such as creating thicker contact pads 1220 connecting to control circuitry 1212.

Dual Image Sensor on a Common Substrate

In imaging applications targeted towards authentication, augmented reality and virtual reality, it is often desirable to capture images of the same scene simultaneously in both the visible and infrared spectral regions. Certain image features for purposes of recognition and identification are better captured in the infrared spectrum, and these features can then be combined with an image in the visible spectrum for human viewing and recording. When both visible and infrared images are captured with the same field of view and pixel count, the two images can also be combined to yield depth information. In this way, feature extraction specific to certain wavelengths can be combined with depth and color information. Although imaging schemes that combine visible and infrared sensing are known in the art, they tend to suffer from practical limitations and high cost, which has limited the adoption of such schemes in commercial applications.

Some embodiments of the present invention address the need for a dual visible/infrared camera solution using the unique properties of photosensitive-film-based image sensors, such as quantum film sensors. In such solutions, a quantum film is deposited over a semiconductor wafer, such as a silicon wafer, with suitable circuits defining the pixels, made by a CMOS process, for example, before deposition of the film. Since the quantum film can be tuned to be sensitive to visible or infrared spectra, two different types of quantum film can be patterned over two arrays of pixel circuits on the same wafer, with everything below the quantum films being identical. Alternatively, the same type of quantum film can be formed over both arrays of pixel circuits, with the addition of suitable filter layers to select the wavelengths that will be incident on each of the quantum films. In either case, two arrays with different wavelength ranges, for example one sensitive to visible light and the other to infrared, can be manufactured next to each other, with the same pitch and circuit behavior, and with precisely-controlled spacing between the arrays.

Figure 13:
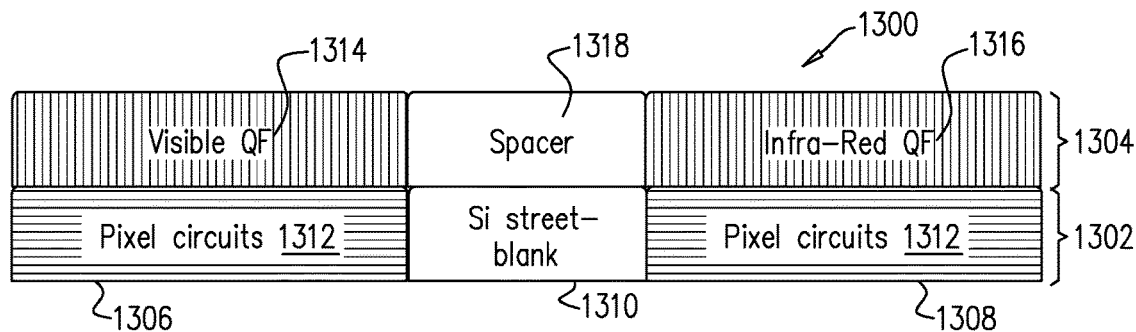
FIG. 13 is a schematic, sectional illustration of a dual image sensor assembly, in accordance with an embodiment of the invention.

FIG. 13 is a schematic, sectional illustration of a dual image sensor assembly 1300 of this sort, in accordance with an embodiment of the invention. A semiconductor substrate, such as a silicon wafer 1302, comprises multiple sensing areas—including two such sensing areas 1306 and 1308 in the present example. The sensing areas may correspond geometrically to different, adjacent dies on wafer 1302, since they are patterned with the same arrays of pixel circuits 1312, and they are separated by a predefined distance corresponding to a "street" 1310 that is normally left blank (unpatterned) between adjacent dies. In the present case, however, sensing areas 1306 and 1308 will not be diced apart, but are rather kept together as parts of the same chip. Pixel circuits 1312 define respective matrices of pixels in sensing areas 1306 and 1308.

A film layer 1304 formed over wafer 1302 comprises photosensitive films 1314 and 1316 over the arrays of pixel circuits 1312 in sensing areas 1306 and 1308, respectively. A spacer 1318, of approximately the same width as street 1310, can be formed in layer 1304 between films 1314 and 1316. In the pictured example, films 1314 and 1316 comprise different, respective materials, which are respectively sensitive to incident radiation in different spectral bands, for example visible and infrared bands as marked in the figure. Films 1314 output photocharge to pixel circuits 1312 in response to radiation incident in the respective spectral bands, and sensing areas 1306 and 1308 thus output visible and infrared image signals, which can be mutually registered in time and space.

Alternatively, films 1314 and 1316 may comprise an identical film having a spectral response extending over both the visible and infrared spectral bands. In this case, one or more optical filters with suitable passbands may be overlaid or otherwise superposed in front of film layer 1304 in order to differentiate the spectral responses of the films. (An arrangement of this sort is described hereinbelow with reference to FIG. 14.) Further alternatively or additionally, such optical filters may be used in combination with wavelength-selective quantum films. Furthermore, although the present examples relate specifically, for the sake of concreteness and clarity, to imaging assemblies that combine visible and infrared sensing, the principles of these embodiments may be extended to any suitable combination of spectral bands in the visible, infrared and/or ultraviolet ranges, with two, three or more pixel arrays on the same chip, each with its own spectral band.

Further alternatively, films 1314 and 1316 and sensing areas 1306 and 1308 may be configured to sense the same wavelength band, possibly with different levels of sensitivity.

The spacing between sensing areas 1306 and 1308 can be set for the specific requirements of the application in which assembly 1300 is to be used. For example, the spacing can be chosen to enable stereoscopic imaging by correlating the locations of objects appearing in the visible and infrared images. Assuming that assembly 1300 is installed in a miniature camera module with a lens having a pupil diameter of 0.6 mm and an f number of 2, the approximate angular resolution of the module will be $0.1^o$ at 940 nm. In order to match this angular resolution, the corresponding parallax distance between sensing areas 1306 and 1308 for objects located at 5 m, for example, is 9.1 mm.

Alternatively, the optics associated with assembly 1300 may image different, respective fields of view onto sensing areas 1306 and 1308. For example, the fields of view may overlap partially, with sensing area 1306 configured for wide-angle imaging and sensing area 1308 for telephoto operation.

Although pixel circuits 1312 in sensing areas 1306 and 1308 have identical geometries, they can be operated in different ways. For example, visible sensing area 1306 can operated in a rolling-shutter mode, while infrared sensing area 1308 operates in a global-shutter mode. This operational mode can be conveniently used in combination with structured infrared light, which can be pulsed in synchronization with the global-shutter timing in order to reduce power consumption of the assembly, as well as reducing the effect of ambient background on the structure light image. The global-shutter infrared sensing area can sense the structured light pattern to provide depth information, while the visible sensing area provides two-dimensional image information. Alternatively, the infrared sensing area can operate in rolling-shutter mode while the visible sensing area operates in global-shutter mode, with or without structured light at an appropriate wavelength.

Figure 14:
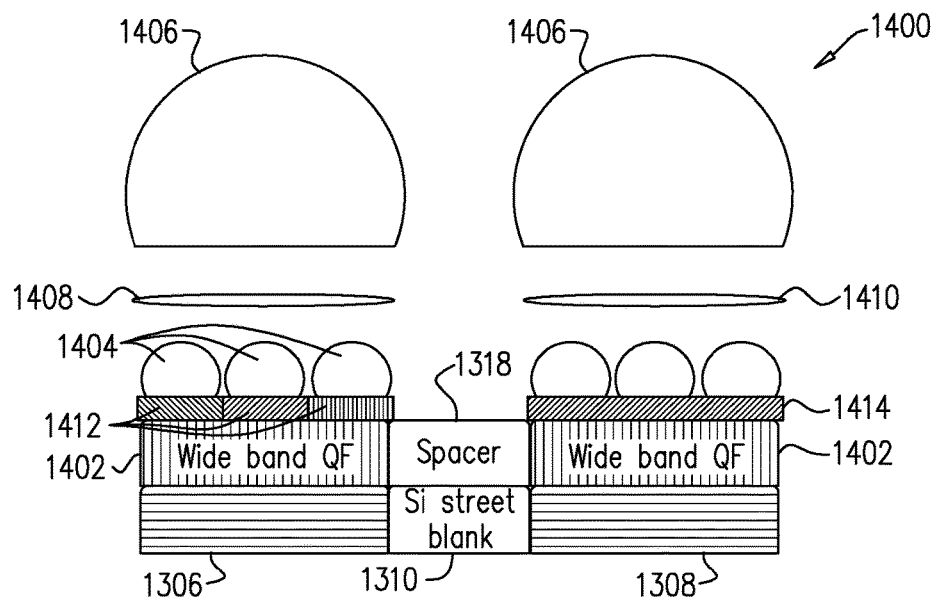
FIG. 14 is a schematic sectional illustration of an imaging module with dual sensing areas, in accordance with another embodiment of the invention.

FIG. 14 is a schematic sectional illustration of an imaging module 1400 with dual sensing areas 1306, 1308, in accordance with another embodiment of the invention. Sensing areas 1306 and 1308 are of similar design and configuration to those described above. In the present embodiment, however, the photosensitive films over the two sensing areas comprise identical films 1402, with the addition of suitable filters, as described below. Arrays of microlenses 1404 are formed over films 1402 in registration with the arrays of pixel circuits 1312. Imaging optics 1406 focus respective images of a scene onto films 1402 over sensing areas 1306 and 1308.

Alternatively, a single imaging lens (simple or compound) can be used to focus images onto both sensing areas.

When identical films 1402 are formed over both sensing areas, optical filter 1408 with a visible passband can be inserted in the optical path of sensing area 1306, with another optical filter 1410 with an infrared passband inserted in the optical path of sensing area 1308. Alternatively or additionally, optical filter layers 1412 and 1414 may be deposited over films 1402 on sensing areas 1306 and/or 1308. For example, filter layer 1412 may comprise a color filter array (CFA), such as a Bayer filter array, in registration with the pixels in sensing area 1306. In this case, filter 1408 may be configured to block infrared radiation, and filter layer 1414 may be replaced by a transparent spacer. Alternatively, module 1400 may comprise only filter layers 1412 and 1414, without the addition of filters 1408 and 1410.

Figure 15:
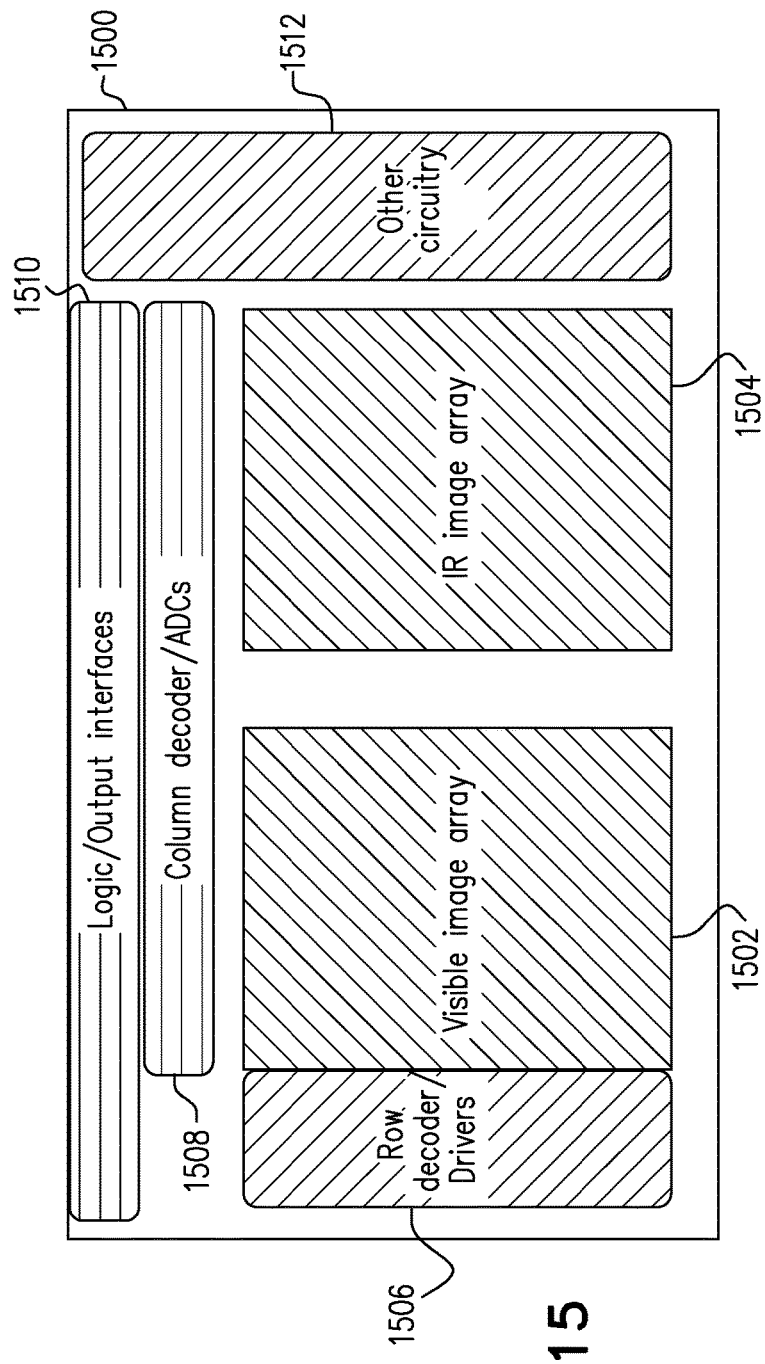
FIG. 15 is a schematic top view of an image sensor chip with dual image sensing areas, in accordance with a further embodiment of the invention.

FIG. 15 is a schematic top view of an image sensor chip 1500 with dual image sensing arrays 1502 and 1504, in accordance with a further embodiment of the invention. Sensing arrays 1502 and 1504 are configured, as described above, to sense light in two different spectral bands, such as visible and infrared bands, respectively. In this embodiment, however, control circuitry is formed on the semiconductor substrate and communicates with the pixel circuits in both sensing arrays 1502 and 1504. Thus, in this case, there is no blank "street" between the arrays as in the preceding embodiments. Sharing of control circuitry in this manner can be useful in reducing chip area and cost, as well as facilitating close synchronization and integration between arrays 1502 and 1504.

Arrays 1502 and 1504 are row-aligned and thus share, in each row of the two arrays, common row decoder and driver circuits 1506, which are the core of the timing engine of the readout circuitry. Column decoders and analog/digital conversion circuits 1508, on the other hand, include separate components for the two sensing arrays. Logic and output interfaces 1510 perform higher-level on-chip processing and drive output interfaces to other devices, thus outputting image data from both of arrays 1502 and 1504. Other circuitry 1512, also shared between arrays 1502 and 1504, can include functions such as timing engines and control of the operational mode of each individual array, for example enabling the use of a rolling shutter in one array while running a global shutter in the other array.

In another embodiment (not shown in the figures), sensing arrays 1502 and 1504 are column-aligned, rather than row-aligned. In this case, the sensing arrays share common column decoders and analog/digital conversion circuits 1508 column by column, while row decoders and driver circuits 1506 are coupled separately to the rows of each of the two arrays. In other respects, resource sharing between arrays 1502 and 1504 is similar to that shown in FIG. 15.

The configuration of FIG. 15 supports other sorts of resource sharing between arrays 1502 and 1504. For example, an opaque layer may be formed over the photosensitive film on one or more of the pixels in one of the arrays to create obscured region 210 (as shown in FIG. 2). Control circuitry on chip 1500, such as logic and output interfaces 1510, uses the signals from the pixels in the obscured region in one of the arrays in correcting the black level of the pixel output values in both of arrays 1502 and 1504.

As another example, row decoder and driver circuits 1506 can drive common electrodes over arrays 1502 and 1504 to apply a bias to the photosensitive films on the arrays, thus enabling readout of signals due to the accumulated photocharge. These common electrodes, corresponding to top electrode 306 (shown in FIG. 3), are at least partially transparent and are formed over the photosensitive films on the two arrays. In some embodiments, row decoder and driver circuits 1506 bias the common electrodes of both of arrays 1502 and 1504 at a common potential. Alternatively, row decoder and driver circuits 1506 bias the common electrodes at different, respective potentials.

Pixel Design for Phase Difference-Based Autofocus

Camera systems use autofocus (AF) in many applications to ensure that relevant portions of scenes, at varying distances from the camera, are acquired as in-focus image planes. Some autofocus systems use image information output by the image sensor of the camera in estimating the optimal distance of the image sensor from the camera lens. On-board electromechanical components then drive the lens position to the optimal distance from the image sensor.

To improve autofocus performance, some cameras use dual-pixel autofocus, and particularly phase difference-based autofocus, based on signals output by special pixels in the image sensing array that are divided into two sub-pixels. These special pixels can be created, for example, by fabricating a metal shield over certain pixels in such a way as to obscure one half of the sensing area of each such pixel. Phase-difference autofocus logic compares the outputs of the divided sub-pixels in order to estimate of whether the image is in focus, and thus provides feedback in order to drive the lens to converge rapidly to a position at which the image is in focus.

Some embodiments of the present invention provide alternative types of autofocus pixels that are appropriate particularly for image sensors in which a photosensitive medium, such as a quantum film, overlies an array of pixel circuits, which are arranged in a regular grid on a semiconductor substrate. The pixel circuits apply control signals to and read out photocharge from respective areas of the photosensitive medium, thus defining the pixels in the array. The term "regular grid" is used to mean that the centers of the pixels in the array, as defined by the pixel circuits, are spaced apart by equal intervals in the horizontal and vertical directions. In typical arrays, the grid is arranged so that the pixels in the array are effectively square or rectangular. Alternatively, the pixels may be laid out on another sort of grid, such as a hexagonal grid.

The autofocus pixels in the present embodiments differ from the remaining pixels in the array in that the pixel circuits of the autofocus pixels comprise conductive components, such as the pixel electrodes or another metal layer below the pixel electrodes, that are spatially offset in different directions relative to the regular grid. The spatial offset may be expressed not only in terms of a shift in the conductive components, but also possibly in enlargement of the conductive components in the direction of the shift. In any case, since these same conductive components occur in all of the pixels in the array (though generally in regular, rather than offset, locations), the autofocus pixels can be fabricated as part of the array without requiring any additional process steps.

Objective optics, such as lens 104 (FIG. 1), focus an image of an object onto the photosensitive medium of the image sensor. Control circuitry, such as circuitry 208 (FIG. 2) or off-chip circuitry (not shown), reads out the photocharge from the pixel circuits and compares the photocharge that is output from pairs of autofocus pixels in which the conductive components are offset in different directions. The control circuitry adjusts the focal setting of the objective optics based on this comparison.

Figure 16:
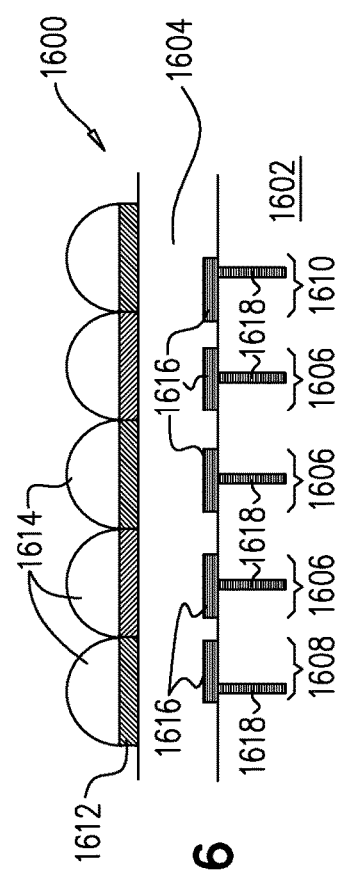
FIG. 16 is a schematic sectional view of a part of an image sensor, illustrating an example implementation of autofocus pixels, in accordance with an embodiment of the invention.

FIG. 16 is a schematic sectional view of a part of an image sensor 1600, illustrating an example implementation of autofocus pixels, in accordance with an embodiment of the invention. Image sensor 1600 comprises a semiconductor substrate 1602, such as a silicon wafer, which is overlaid by a photosensitive medium 1604, such as a quantum film. An array of pixel circuits 1606, such as the circuits in pixel circuitry layer 302 (FIGS. 3A-3C), are formed in a regular grid on substrate 1602. Pixel circuits 1606 comprise pixel electrodes 1616, which are arranged on a regular grid and are connected to the other circuit components by vias 1618, thus enabling the pixel circuits to apply control signals to and read out photocharge from respective areas of photosensitive medium 1604. The pixels of image sensor 1600 in this example are overlaid by a mosaic filter 1612 and respective microlenses 1614.

In contrast to the regular grid of imaging pixels defined by pixel circuits 1606, pixel circuits 1608 and 1610 define a pair of autofocus pixels: In the autofocus pixel at the left in the figure, pixel electrode 1616 is shifted to the right, while the pixel electrode in the autofocus pixel at the right in the figure is shifted to the left. Assuming the pixels to have a width and height of 1.1 am, and the width and height of electrodes 1616 to be 0.35 am, shifting the electrodes in pixel circuits 1608 and 1610 of the autofocus pixels by 0.1 am will increase the sensitivity of these pixels to light coming in from one side of the pixel by a factor of 1.5 to 2, relative to the other side. This difference in sensitivity is sufficient to enable the control circuitry to detect an imbalance upon comparing the outputs of the pair of autofocus pixels shown in FIG. 16, and thus to correct the focal setting of the lens accordingly.

Figure 17:
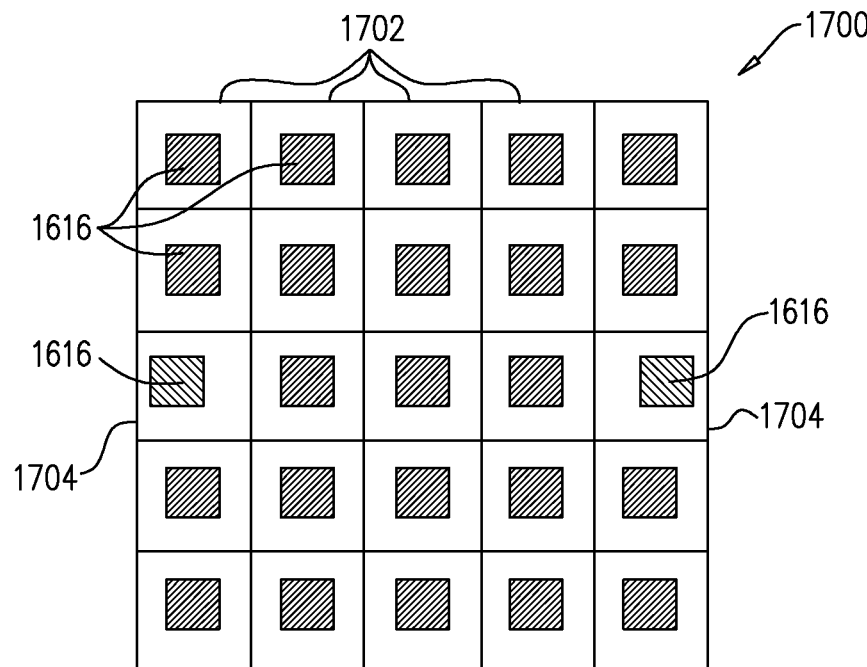
FIG. 17 is a schematic top view of a part of an image sensor including autofocus pixels, in accordance with another embodiment of the invention.

FIG. 17 is a schematic top view of a part of an image sensor 1700 including autofocus pixels 1704, in accordance with another embodiment of the invention. As in the preceding embodiment, pixels 1702 define a regular grid, with pixel electrodes 1616 centered within these pixels. In autofocus pixels 1704, however, pixel electrodes 1616 are shifted in opposing directions relative to the grid of pixels 1702. The control circuitry can use the signals from autofocus pixels 1704 in the manner described above.

Figure 18:
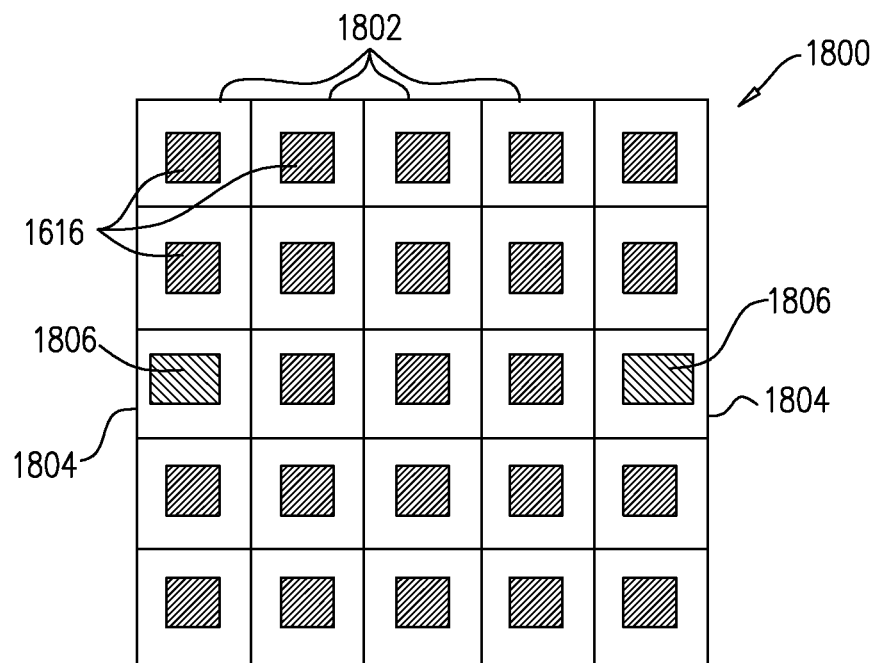
FIG. 18 is a schematic top view of a part of an image sensor including autofocus pixels, in accordance with yet another embodiment of the invention

FIG. 18 is a schematic top view of a part of an image sensor 1800 including autofocus pixels 1804, in accordance with yet another embodiment of the invention. In this case, again, pixels 1802 define a regular grid, with pixel electrodes 1616 centered within these pixels. In autofocus pixels 1804, however, pixel electrodes 1806 are both shifted in opposing directions relative to the grid of pixels 1802 and are enlarged relative to the remaining pixel electrodes. This enlargement of the areas of pixel electrodes 1806, taken together with the shift, can enhance the sensitivity of these pixels to light coming in from one side of the pixel by a factor of 2 to 3, relative to the other side.

Figure 19:
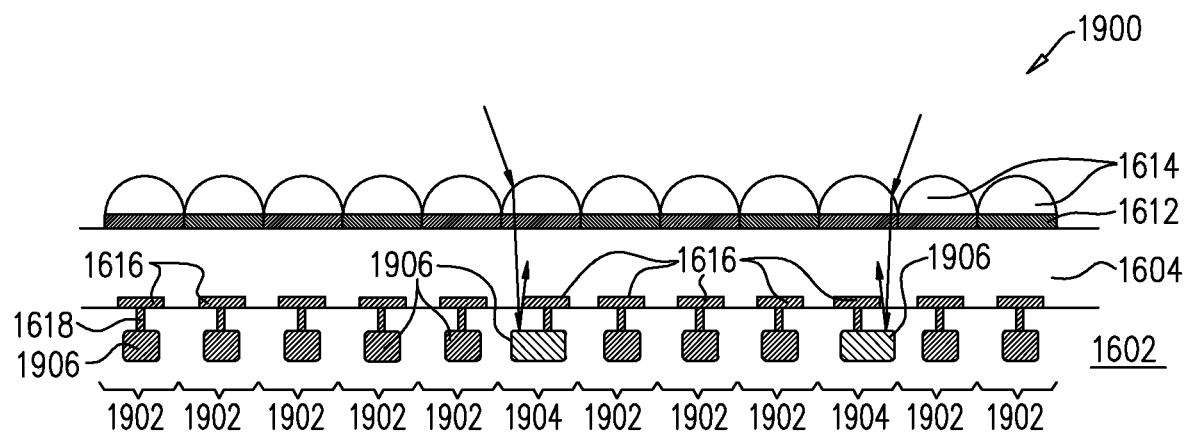
FIG. 19 is a schematic sectional view of a part of an image sensor, illustrating an alternative implementation of autofocus pixels, in accordance with an embodiment of the invention.

FIG. 19 is a schematic sectional view of a part of an image sensor 1900, illustrating an alternative implementation of autofocus pixels, in accordance with an embodiment of the invention. Most of the elements of image sensor 1900 are similar to those of image sensor 1600, as described above with reference to FIG. 16, and are therefore labeled with the same reference numbers. FIG. 19, however, shows an additional metal layer 1906 within the regular grid of pixel circuits 1902. Metal layer 1906 can not only serve as a conductive component within the pixel circuits, but also reflects light that has passed through photosensitive medium 1604 back into the photosensitive medium, thus enhancing the sensitivity of the corresponding pixel.

In the autofocus pixels defined by pixel circuits 1904, metal layer 1906 is enlarged asymmetrically, thus creating an offset in these pixels relative to the remaining pixels in the array. The effect of this offset is illustrated by the arrows in FIG. 19, which represent incoming rays of light that are incident on the autofocus pixels at relatively large angles. Metal layer 1906 in each of the autofocus pixels reflects the angled rays on one side of the pixel back into medium 1604, but not on the other side, thus enhancing the sensitivity of the corresponding pixels preferentially to incident light from different directions.

Although only a single pair of autofocus pixels is shown in each of the preceding examples, in typical use multiple pixel pairs of this sort may be formed, with opposing spatial phases in each pair due to offset of the pixel electrodes or other metal layer. The use of multiple autofocus pixel pairs ensures that there will be a sufficient number of autofocus samples in order to detect the best focal distance based on a selected area of the image (which can be selected by the user or automatically selected by the autofocus controller). It may also be desirable to include certain irregularities in the distribution of the autofocus pixels, in order to avoid aliasing effects that might otherwise be encountered.

When a given area of the image sensor is chosen for focusing, two sets of sub-images are analyzed by the autofocus controller: one sub-image comprising autofocus pixels that are preferentially sensitive to light arriving from one direction (for example, from the left), and the other sub-image comprising pixels that are preferentially sensitive to light from the other direction (for example, from the right).

In an out-of-focus image region, the spatial frequency information from the scene will be mapped differently (with a different phase) onto the "left" sub-image and the "right" sub-image. The autofocus controller uses this difference as a basis for determining the change required in lens-to-imager-distance. The controller considers the image in the region of interest to be in focus when the image based on the "left" sub-image and the "right" sub-image are in phase, with maximal correlation between the sub-images.

To find the correct focal distance accurately over various regions of the image, it is desirable that the image sensor include a large number of autofocus pixels. At the same time, it is desirable that these pixels continue to provide image information when they are not being used for autofocus measurements. One advantage of the present embodiments is that the autofocus pixels will continue to respond to incident light intensity in a manner similar to the remaining pixels in the image sensing array, though the pixel sensitivities may be slightly modified due to the differences in the locations and/or sizes of the metal components of the pixel circuits. As the locations of the autofocus pixels in the array are known, their signal outputs can be corrected, for example by an on-line image signal processor (ISP), to correct for the differences in sensitivity. Alternatively or additionally, when a color mosaic film overlies the image sensors, the ISP may interpolate the values of the autofocus pixels from other nearly pixels of the same color.

Although one of the examples presented above relates to pixels of a certain size, the principles of the present embodiments may be applied in creating autofocus pixels of larger or smaller sizes, as well. The characteristics and layout of the autofocus pixels may also be tailored to fit the aberrations and chief ray angle characteristics of the specific lens that is to be used in focus light onto the image sensor in question. In other words, the shifts and/or enlargement of the conductive components may be chosen in a way that is specific to the location of each pixel with respect to the center of the sensing array.

Image Sensors with Enhanced Acceptance of High Chief Ray Angles

In camera modules that incorporate an image sensor with a lens assembly, it is often desirable that the z-direction height of the total module (i.e., the dimension perpendicular to the image plane) be kept as low as possible, while maintaining a wide field of view with the desired focal length and f-number. As the lens assembly is made shorter, the chief ray angle of incoming light at the edges of the image sensor becomes higher, i.e., farther from the normal to the image plane. This high chief ray angle leads to loss of sensitivity at the edges of the array.

To reduce these losses in conventional, silicon-based image sensors, the microlenses and elements of the color filter array (CFA) may be shifted inward, toward the center of the array, with the shift increasing radially with increasing distance from the center. As a result of the shift, more of the light at higher angles is collected at the edges of the array.

In image sensors that comprise a photosensitive medium, such as a quantum film, overlaid on an array of pixel circuits, the pixel electrodes act as collectors of photocharge generated by photons that are absorbed in the photosensitive medium. The present embodiments take advantage of this feature in increasing the sensitivity of the pixels to light at high chief ray angles, by shifting the pixel electrodes radially outward relative to the center of the array. This feature can be applied on its own or in combination with the microlens shift described above.

Figure 20A:
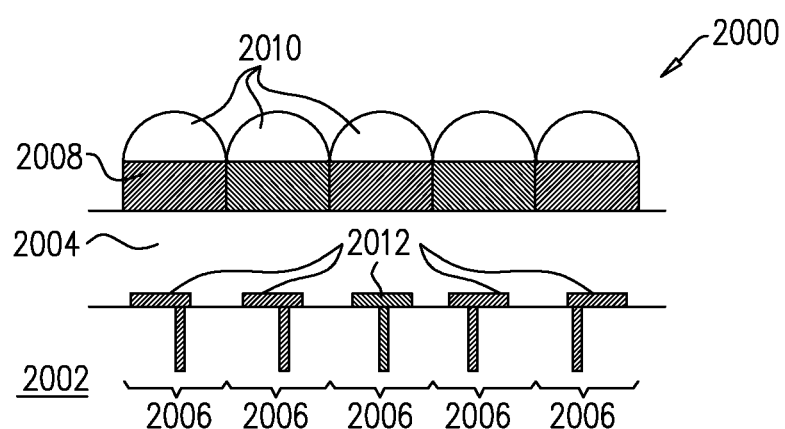
FIG. 20A is a schematic sectional view of an image sensor with enhanced acceptance of high chief ray angles, in accordance with an embodiment of the invention.
Figure 20B:
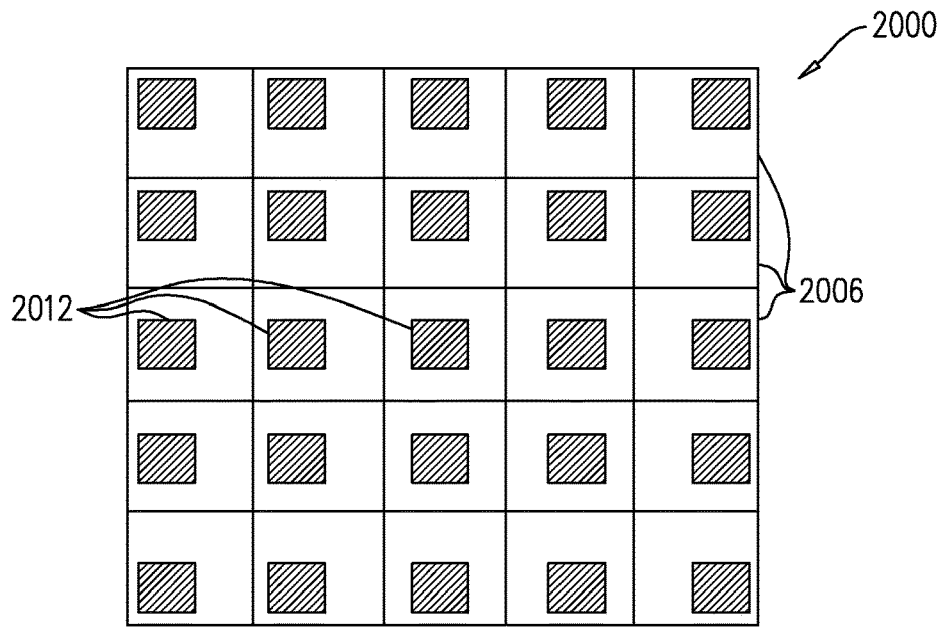
FIG. 20B is a schematic top view of the image sensor of FIG. 20A.

FIGS. 20A and 20B schematically illustrate a part of an image sensor 2000 with enhanced acceptance of high chief ray angles, in accordance with an embodiment of the invention. FIG. 20A is a sectional view, while FIG. 20B is a top view. Image sensor 2000 comprises a photosensitive medium 2004 overlaid on an array of pixel circuits, which are arranged in a regular grid on a semiconductor substrate 2002, such as a silicon wafer, and define respective pixels 2006 of the image sensor. Each pixel has a corresponding filter element 2008 in a color filter array and a microlens 2010, which focuses incoming light onto the pixel.

Pixel electrodes 2012 read out photocharge from respective areas of photosensitive medium 2004 to the pixel circuits in each pixel 2006 of the array. To accommodate the increasing chief ray angles in the peripheral regions of the array, pixel electrodes 2012 are spatially offset, relative to the regular grid of pixels, in respective directions away from a center of the array. In camera modules that include objective optics, such as lens system 104 (FIG. 1), which form an image of an object on photosensitive medium 2004, the spatial offset of the pixel electrodes in the peripheral regions of the array can be set in accordance with the chief ray angle of the light that is focused onto the photosensitive medium by the objective optics, so as to minimize the loss of sensitivity in the peripheral regions.

The shifts of pixel electrodes 2012 may be applied incrementally, from pixel to pixel, as a function of radial distance and direction from the center of the array. Alternatively, for ease of design and production of image sensor 2000, the shifts may be applied in batches to different groups of the pixels, so that the same shift of the pixel electrodes is applied in all the pixels in each group.

Figure 21:
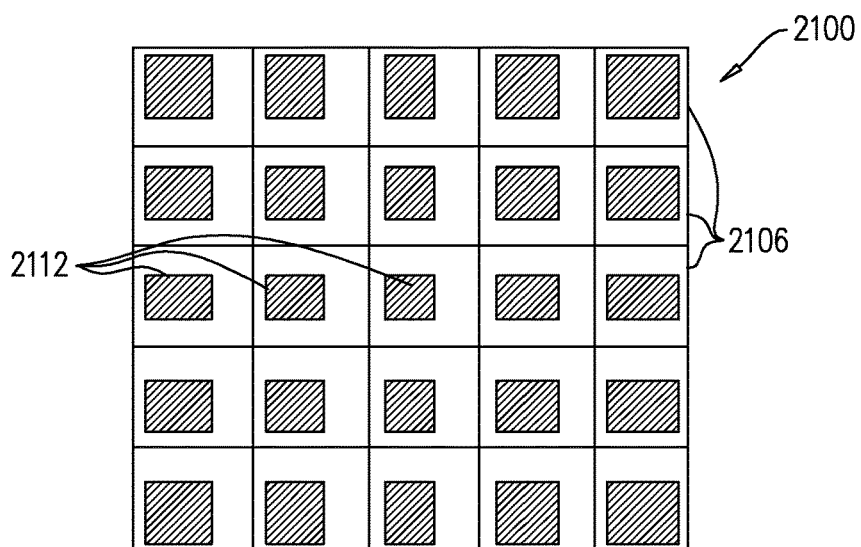
FIG. 21 is a schematic top view of a part of an image sensor with enhanced acceptance of high chief ray angles, in accordance with another embodiment of the invention.

FIG. 21 is a schematic top view of a part of an image sensor 2100 with enhanced acceptance of high chief ray angles, in accordance with another embodiment of the invention. In this case, pixel electrodes 2112 in pixels 2106 in the peripheral regions of the pixel array of sensor 2100 are enlarged in the appropriate radial directions relative to the pixel electrodes in the center of the array. This enlargement is also useful in offsetting the loss of sensitivity of the peripheral regions of image sensor 2100 due to high chief ray angles. It may be applied independently of or in conjunction with the shift described above.

Figure 22:
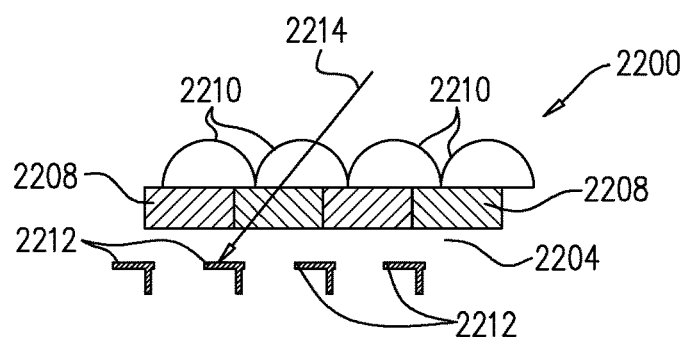
FIG. 22 is a schematic sectional view of a part of an image sensor with enhanced acceptance of high chief ray angles, in accordance with yet another embodiment of the invention.

FIG. 22 is a schematic sectional view of a part of an image sensor 2200 with enhanced acceptance of high chief ray angles, in accordance with yet another embodiment of the invention. As in the embodiment of FIGS. 20A/B, image sensor 2200 comprises a photosensitive medium 2204 overlaid on an array of pixel circuits, which define respective pixels 2006 of the image sensor. Each pixel has a corresponding filter element 2208 and a microlens 2210, which focuses incoming light onto the pixel. In this case, however, microlenses 2210 are spatially offset, relative to the regular grid, in respective directions toward the center of the pixel array, while pixel electrodes 2212 are shifted away from the center. This arrangement enhances the ability of the pixel electrodes to capture photocharge due to light that is incident at high angles, such as a ray 2214 shown in FIG. 22.

The inventors have found this latter arrangement, combining offset of the microlenses in one direction and the pixel electrodes in the other, to be particularly effective in achieving acceptable image sensor sensitivity at larger chief ray angles than can be accommodated using only shift of the microlenses. As demonstrated by specific examples described in the above-mentioned U.S. Provisional Patent Application 62/411,522, combinations of microlens offset with electrode offset can be used in cameras with both very low Z-direction height and large pixel array dimensions, to accommodate chief range angles at the edges of the ray in the range of $40^O$ and even higher.

Although the embodiments described above relate mainly to film-based image sensors, the principles of these embodiments may similarly be applied, mutatis mutandis, in image sensors of other types, using other sorts of photosensitive media. Furthermore, although various features of image sensors are described separately above, some or all of these features may be implemented together in a single image sensing device.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. Imaging apparatus, comprising:
    a semiconductor substrate, which comprises at least first and second sensing areas with a predefined separation between the sensing areas;
    first and second arrays of pixel circuits, which are formed respectively on the first and second sensing areas and define respective first and second matrices of pixels;
    first and second photosensitive films, which are disposed respectively over the first and second arrays of pixel circuits, and which are configured to output photocharge to the pixel circuits in response to radiation incident on the apparatus in different, respective first and second spectral bands;
    first and second common electrodes, which are at least partially transparent and are formed respectively over the first and second photosensitive films; and
    control circuitry, which is coupled to apply respective biases to the first and second common electrodes at different, respective first and second potentials, and to receive signals from the first and second arrays of pixel circuits due to photocharge accumulated by the pixel circuits in response to application of the biases.

2. The apparatus according to claim 1, wherein the photosensitive films comprise quantum films.

3. The apparatus according to claim 1, wherein the first and second photosensitive films comprise different, respective materials, which are respectively sensitive to the incident radiation in the first and second spectral bands.

4. The apparatus according to claim 1, wherein the first and second photosensitive films comprise an identical film having a spectral response extending over the first and second spectral bands, and the apparatus comprises at least a first filter, having a passband within the first spectral band, overlying the first photosensitive film.

5. The apparatus according to claim 1, wherein the first spectral band is a visible band, and the second spectral band is an infrared band.

6. The apparatus according to claim 1, and comprising microlenses formed over the first and second photosensitive films in registration with the arrays of pixel circuits.

7. The apparatus according to claim 1, and comprising control circuitry formed on the semiconductor substrate and coupled to communicate with both of the first and second arrays of pixel circuits.

8. The apparatus according to claim 1, and comprising first and second imaging optics, which are configured to focus first and second images, respectively, onto the first and second photosensitive films.

9. The apparatus according to claim 1, and comprising:
an opaque layer formed over the photosensitive film on one or more of the pixels in one of the arrays; and
control circuitry, which is coupled to receive signals from the pixel circuits in response to the photocharge output by the photosensitive films, and to convert the received signals to respective pixel output values while correcting a black level of the output values from both the first and second arrays using the signals received from the one or more of the pixels over which the opaque layer is formed.

10. The apparatus according to claim 1, wherein the control circuitry is configured to bias both the first and second common electrodes at a common potential.

11. The apparatus according to claim 1, wherein the first and second arrays of the pixel circuits are row-aligned, and wherein the control circuitry comprises common row decoder and driver circuits that are shared over each row of both the first and second arrays.

12. The apparatus according to claim 1, wherein the first and second arrays of the pixel circuits are column-aligned, and wherein the control circuitry comprises common column decoders and analog/digital conversion circuits that are shared over each column of both the first and second arrays.

13. A method for producing an image sensor, the method comprising:
forming first and second arrays of pixel circuits, defining respective first and second matrices of pixels, on respective first and second sensing areas of a semiconductor substrate with a predefined separation between the sensing areas;
forming first and second photosensitive films respectively over the first and second arrays of pixel circuits, so as to output photocharge to the pixel circuits in response to radiation incident on the image sensor in different, respective first and second spectral bands;
forming first and second common electrodes, which are at least partially transparent, respectively over the first and second photosensitive films; and
coupling control circuitry to apply respective biases to the first and second common electrodes at different, respective first and second potentials, and to receive signals from the first and second arrays of pixel circuits due to photocharge accumulated by the pixel circuits in response to application of the biases.

14. The method according to claim 13, wherein the photosensitive films comprise quantum films.

15. The method according to claim 13, wherein the first and second photosensitive films comprise different, respective materials, which are respectively sensitive to the incident radiation in the first and second spectral bands.

16. The method according to claim 13, wherein the first and second photosensitive films comprise an identical film having a spectral response extending over the first and second spectral bands, and the method comprises overlaying at least a first filter, having a passband within the first spectral band, on the first photosensitive film.

17. The method according to claim 13, wherein the first spectral band is a visible band, and the second spectral band is an infrared band.

18. The method according to claim 13, and comprising forming on the semiconductor substrate control circuitry coupled to communicate with both of the first and second arrays of pixel circuits.

19. The method according to claim 13, and comprising:
forming an opaque layer formed over the photosensitive film on one or more of the pixels in one of the arrays;
coupling control circuitry to receive signals from the pixel circuits in response to the photocharge output by the photosensitive films; and
converting the received signals to respective pixel output values while correcting a black level of the output values from both the first and second arrays using the signals received from the one or more of the pixels over which the opaque layer is formed.

* * * * *